(12) United States Patent
Yu et al.

(10) Patent No.: US 12,545,107 B2
(45) Date of Patent: Feb. 10, 2026

(54) DISPLAY DEVICE

(71) Applicant: LG Display Co., Ltd., Seoul (KR)

(72) Inventors: Hyeonhye Yu, Paju-si (KR); Keongjin Lee, Paju-si (KR); DaeHeung Lee, Paju-si (KR); SeHong Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/769,076

(22) Filed: Jul. 10, 2024

(65) Prior Publication Data

US 2025/0128599 A1 Apr. 24, 2025

(30) Foreign Application Priority Data

Oct. 20, 2023 (KR) .......................... 10-2023-0141001

(51) Int. Cl.
*B60K 35/22* (2024.01)

(52) U.S. Cl.
CPC ...... *B60K 35/22* (2024.01); *B60K 2360/1523* (2024.01); *B60K 2360/1526* (2024.01); *B60K 2360/48* (2024.01)

(58) Field of Classification Search
CPC ............ B60K 35/22; B60K 2360/1523; B60K 2360/1526; B60K 2360/48; H10K 59/122; G02F 1/1323; G09G 2320/028; G09G 2320/068
See application file for complete search history.

(56) References Cited

U.S. PATENT DOCUMENTS

| | | | | |
|---|---|---|---|---|
| 7,034,453 B2 * | 4/2006 | Kai | ...................... | H10K 59/122 313/506 |
| 2005/0057151 A1 * | 3/2005 | Kuwabara | .............. | H05B 33/22 313/506 |
| 2012/0098414 A1 * | 4/2012 | Nakamura | ........... | H10K 59/122 445/24 |
| 2013/0105782 A1 * | 5/2013 | Matsushima | ........ | H10H 20/813 257/89 |
| 2014/0097409 A1 | 4/2014 | Choi et al. | | |
| 2015/0060820 A1 | 3/2015 | Takagi et al. | | |
| 2015/0060822 A1 * | 3/2015 | Kamiya | .............. | H10K 59/873 257/40 |

(Continued)

FOREIGN PATENT DOCUMENTS

| | | |
|---|---|---|
| CN | 111326552 A | 6/2020 |
| CN | 112750872 A | 5/2021 |

(Continued)

*Primary Examiner* — Christopher E Leiby
(74) *Attorney, Agent, or Firm* — Seed Intellectual Property Law Group LLP

(57) ABSTRACT

A display device is disclosed that is capable of enhancing light extraction efficiency and lower power driving through high luminance characteristics. The display device includes an insulation layer positioned on a substrate and including at least one concave portion including a flat portion and an inclined portion surrounding the flat portion in one subpixel. The display device further includes a bank layer positioned on the insulation layer and including an opening area in the subpixel where the opening area is surrounded by the inclined portion, and where a center point of an area of the concave portion does not overlap a center point of the opening area of the bank layer.

21 Claims, 27 Drawing Sheets narrow viewing angle mode 1000 wide viewing angle mode 1000

(56) References Cited

U.S. PATENT DOCUMENTS

| | | | |
|---|---|---|---|
| 2016/0087018 A1* | 3/2016 | Shim | H10K 59/122 257/40 |
| 2018/0122876 A1* | 5/2018 | Shim | H10K 59/131 |
| 2019/0326537 A1 | 10/2019 | Kobayashi et al. | |
| 2020/0035768 A1* | 1/2020 | Okabe | H10K 50/11 |
| 2020/0194711 A1* | 6/2020 | Kim | H10K 50/12 |
| 2020/0203447 A1* | 6/2020 | Lee | H10K 50/818 |
| 2020/0358034 A1 | 11/2020 | Koshihara | |
| 2021/0066415 A1 | 3/2021 | Lee et al. | |
| 2021/0134893 A1* | 5/2021 | Lee | H10K 50/818 |
| 2021/0257349 A1* | 8/2021 | Yang | H01L 25/0753 |
| 2021/0399263 A1* | 12/2021 | Montgomery | H10K 50/852 |
| 2022/0085340 A1 | 3/2022 | Lee et al. | |
| 2022/0115629 A1* | 4/2022 | Suzuki | G02B 19/0014 |
| 2022/0123183 A1* | 4/2022 | Kim | H01L 25/0753 |
| 2022/0140289 A1* | 5/2022 | Tak | H10K 50/858 257/40 |
| 2022/0231089 A1* | 7/2022 | Cho | G03F 1/32 |
| 2022/0336780 A1* | 10/2022 | Sun | G02B 1/02 |
| 2023/0113069 A1 | 4/2023 | Baek et al. | |
| 2023/0172036 A1* | 6/2023 | Xu | H10K 59/122 257/40 |
| 2024/0155914 A1* | 5/2024 | Shin | H10K 59/80523 |
| 2025/0017050 A1 | 1/2025 | Katayama et al. | |
| 2025/0056960 A1* | 2/2025 | Kobori | H10K 59/122 |
| 2025/0057018 A1* | 2/2025 | Song | H10K 59/353 |
| 2025/0057023 A1* | 2/2025 | Cho | G02B 27/283 |
| 2025/0133903 A1* | 4/2025 | Hodo | H10K 59/122 |

FOREIGN PATENT DOCUMENTS

| | | |
|---|---|---|
| GB | 2623630 A | 4/2024 |
| JP | 2009301910 A | 12/2009 |
| JP | 2013114773 A | 6/2013 |
| JP | 2015050011 A | 3/2015 |
| JP | 2016054085 A | 4/2016 |
| JP | 2019133816 A | 8/2019 |
| JP | 2022069134 A | 5/2022 |
| KR | 20210072544 A | 6/2021 |
| TW | 201946269 A | 12/2019 |
| WO | 2023089447 A1 | 5/2023 |

\* cited by examiner

⊙ : center point G1 of CNC1(G1)
× : center point G2 of OPN1(G2)

DISPLAY DEVICE

CROSS-REFERENCE TO RELATED APPLICATION

This application claims priority from Korean Patent Application No. 10-2023-0141001 filed on Oct. 20, 2023, the entirety of which is incorporated herein by reference for all purposes as if fully set forth herein.

BACKGROUND

Technical Field

Embodiments of the disclosure relate to a display device.

Description of Related Art

As the information society develops, demand for display devices for displaying images in various forms is increasing. Various display devices, such as liquid crystal display devices, plasma display devices, and organic light emitting display devices, are recently being utilized.

A display device that implements various information as a screen is a key technology in the era of information and communication technology, and plays a role to display various information in a display area.

While display devices that exhibit excellent display quality and luminous efficiency are generally desirable, there have been issues developing displays that exhibit these characteristics. For example, prior displays that have excellent display quality may have a low luminous efficiency and thus utilize too much power. In addition, numerous challenges have been encountered in prior attempts to produce light emitting elements with increased luminous efficiency, thus reducing power consumption. Accordingly, it would be advantageous to have a display device that overcomes these and other deficiencies and disadvantages of known displays.

BRIEF SUMMARY

The importance of luminous efficiency is increasing as display devices preferably use less power according to technological development. In some embodiments, display devices are implemented in environments with a limited power supply, thus increasing the importance of luminous efficiency.

The light efficiency of a display device may be determined by the light emitting element included in the display device. A display device including light emitting elements with excellent light efficiency may have excellent light efficiency. Therefore, enhancing the light efficiency of the light emitting element may be considered as a method to enhance the light efficiency of the display device. However, it is difficult to enhance the light efficiency of the light emitting element and prior attempts have generally been insufficient or ineffective solutions.

Embodiments of the disclosure may provide a display device capable of enhancing light extraction efficiency.

Embodiments of the disclosure may provide a display device capable of low-power driving through high luminance characteristics.

Embodiments of the disclosure may provide a display device comprising an insulation layer positioned on a substrate and including at least one concave portion including a flat portion and an inclined portion surrounding the flat portion in one subpixel and a bank layer positioned on the insulation layer and including an opening area in the subpixel, wherein the opening area is surrounded by the inclined portion, and wherein a center point of an area of the concave portion does not overlap a center point of the opening area of the bank layer.

Embodiments of the disclosure may provide a display device comprising an insulation layer positioned on a substrate and including at least one concave portion including a flat portion and an inclined portion surrounding the flat portion in one subpixel and a bank layer positioned on the insulation layer and including an opening area in the subpixel, wherein the opening area is surrounded by the inclined portion, wherein the inclined portion of the concave portion includes a first inclined portion and a second inclined portion horizontally facing an upper portion of the subpixel and the first inclined portion, and wherein when measured in parallel with the upper surface of the subpixel, a distance from a center line of the opening area of the bank layer to an upper surface of the first inclined portion differs from a distance from the center line of the opening area of the bank layer to an upper surface of the second inclined portion.

According to embodiments of the disclosure, there may be provided a display device capable of enhancing light extraction efficiency.

According to embodiments of the disclosure, there may be provided a display device capable of low-power driving through high luminance characteristics.

DESCRIPTION OF THE SEVERAL VIEWS OF THE DRAWINGS

The above and other embodiments, features, and advantages of the disclosure will be more clearly understood from the following detailed description, taken in conjunction with the accompanying drawings, in which.

DETAILED DESCRIPTION

Figure 1A:
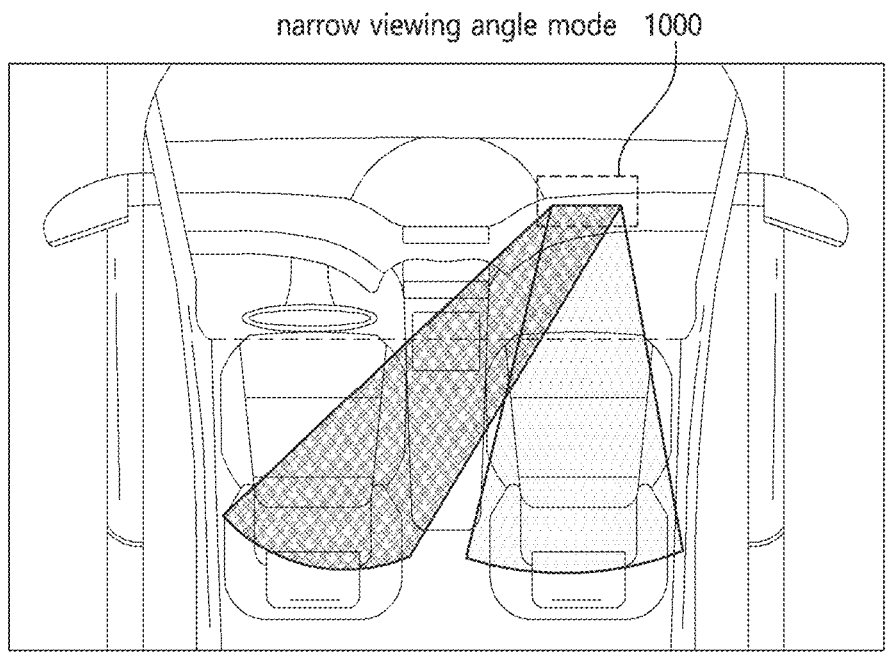
FIG. 1A is a plan view illustrating a narrow viewing angle mode among mode-switchable privacy modes as an example according to an embodiment of the disclosure.

In the following description of examples or embodiments of the disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the disclosure, detailed descriptions of well-known functions and components incorporated herein will be omitted when it is determined that the description may make the subject matter in some embodiments of the disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the disclosure. Each of these terms is not used to define essence, order, sequence, or number of elements, etc., but is used merely to distinguish the corresponding element from other elements.

When it is mentioned that a first element "is connected or coupled to", "contacts or overlaps," etc., a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc., each other via a fourth element. Here, the second element may be included in at least one of two or more elements that "are connected or coupled to", "contact or overlap", etc., each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes, etc., are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various embodiments of the disclosure are described in detail with reference to the accompanying drawings.

Figure 1B:
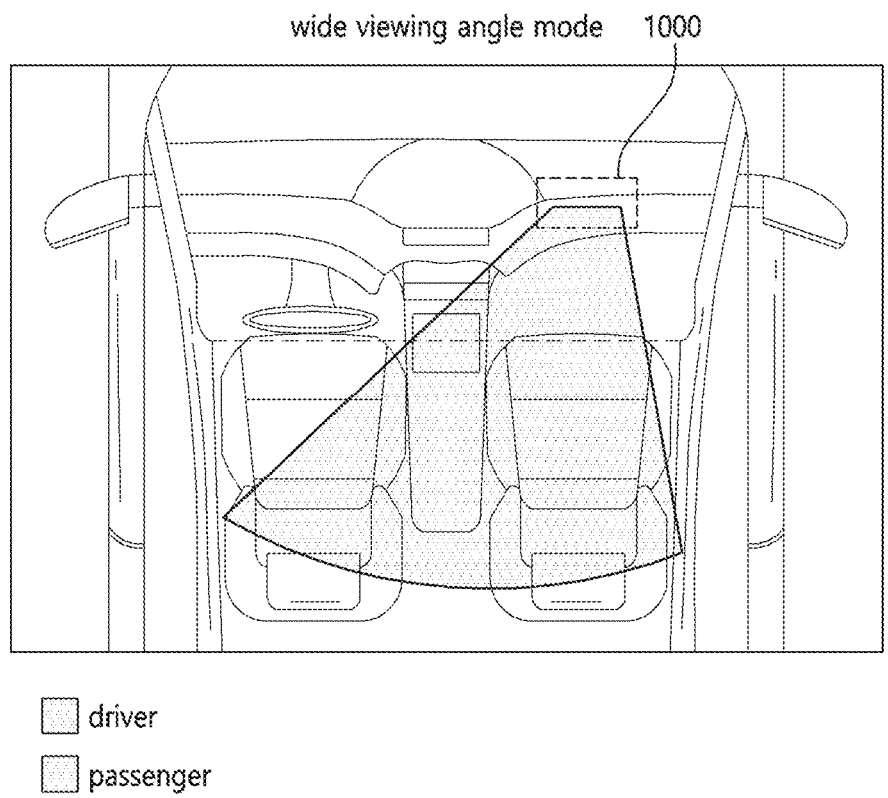
FIG. 1B is a plan view illustrating a wide viewing angle mode among mode-switchable privacy modes as another example according to an embodiment of the disclosure.

FIGS. 1A and 1B are plan views illustrating an example in which a display device 1000 having a mode switchable privacy mode is installed at a front portion of a passenger seat or in a dashboard of a vehicle in front of a passenger seat and is in a narrow viewing angle mode and a wide viewing angle mode of the mode switchable privacy mode, respectively, according to an embodiment of the disclosure.

As illustrated in FIGS. 1A and 1B, a display device 1000 capable of switching between a wide viewing angle mode and a narrow viewing angle mode may be installed at a front portion of the passenger seat of a vehicle, which may be dash board or other internal component of a vehicle in front of the passenger seat.

However, the place where the display device 1000 is installed is not limited to the front portion of the passenger seat, but may be disposed in various places such as the front portion of the driver's seat, the rear portion of the passenger seat, the rear portion of the driver's seat, etc., and the place where the display device 1000 is installed is not limited to a vehicle and may be applied to all places requiring privacy protection, including for personal mobile devices, computers, and the like.

As illustrated in FIG. 1A, while in the narrow viewing angle mode, the display device 1000 provides an image having a luminance of 1% or more to a passenger, but an image having a luminance of less than 1% is provided to a driver.

In other words, since visibility may be secured for the passenger sitting in the passenger seat, but not for the driver sitting in the driver's seat, privacy may be protected for the passenger sitting in the passenger seat.

As illustrated in FIG. 1B, while in the wide viewing angle mode, the display device 1000 provides an image having a luminance of 1% or more to both the passenger and the driver, thereby providing an image that may be shared by both the passenger and the driver.

In other words, in the wide viewing angle mode, visibility may be secured not only for the passenger sitting in the passenger seat but also for the driver sitting in the driver's seat.

Figure 2:
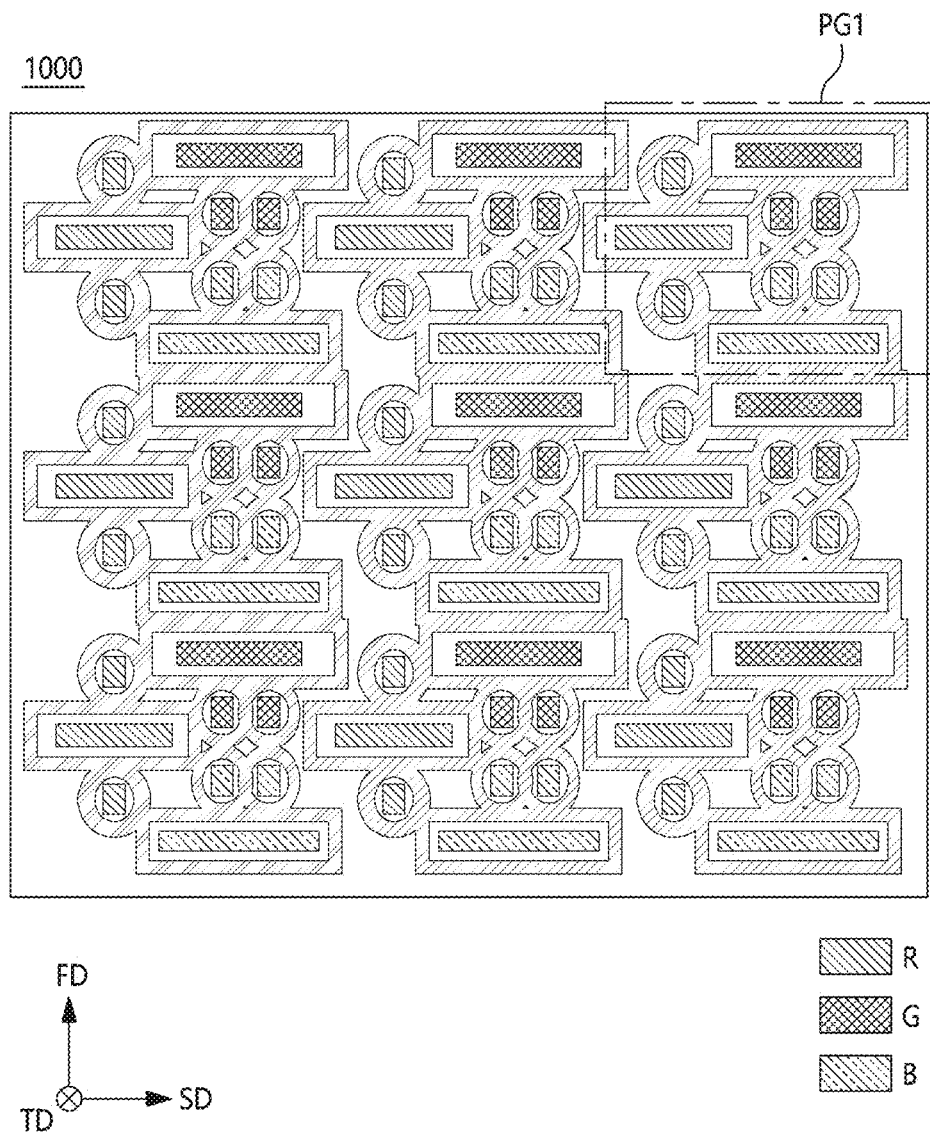
FIG. 2 is a plan view illustrating subpixels arranged in an active area of a display device according to an embodiment of the disclosure.

FIG. 2 is a plan view illustrating a partial area of subpixels arranged in an active area of a display device according to an embodiment of the disclosure.

Referring to FIG. 2, pixels disposed in an active area of a display device 1000 may include subpixels having different colors to implement colors of an image.

The subpixels may include a red subpixel R, a green subpixel G, and a blue subpixel B.

Each of the subpixels may further include a white subpixel, but in FIG. 2, a case of including a red subpixel R, a green subpixel G, and a blue subpixel B is described as an example.

Each of the subpixels may include a pixel circuit and a light emitting element.

By differentially designing the sizes and arrangements of subpixels included in the first pixel group PG1 among the subpixels disposed in the active area of the display device 1000 of FIG. 2, a switchable privacy mode system capable of switching between a wide viewing angle mode and a narrow viewing angle mode may be implemented.

However, the sizes and arrangement order of the subpixels for implementing the mode switchable privacy mode are not limited thereto, but the arrangement of three subpixels having a wide size and six subpixels having a narrow size in the first pixel group PG1 is described as an example in connection with FIG. 2.

Figure 3:
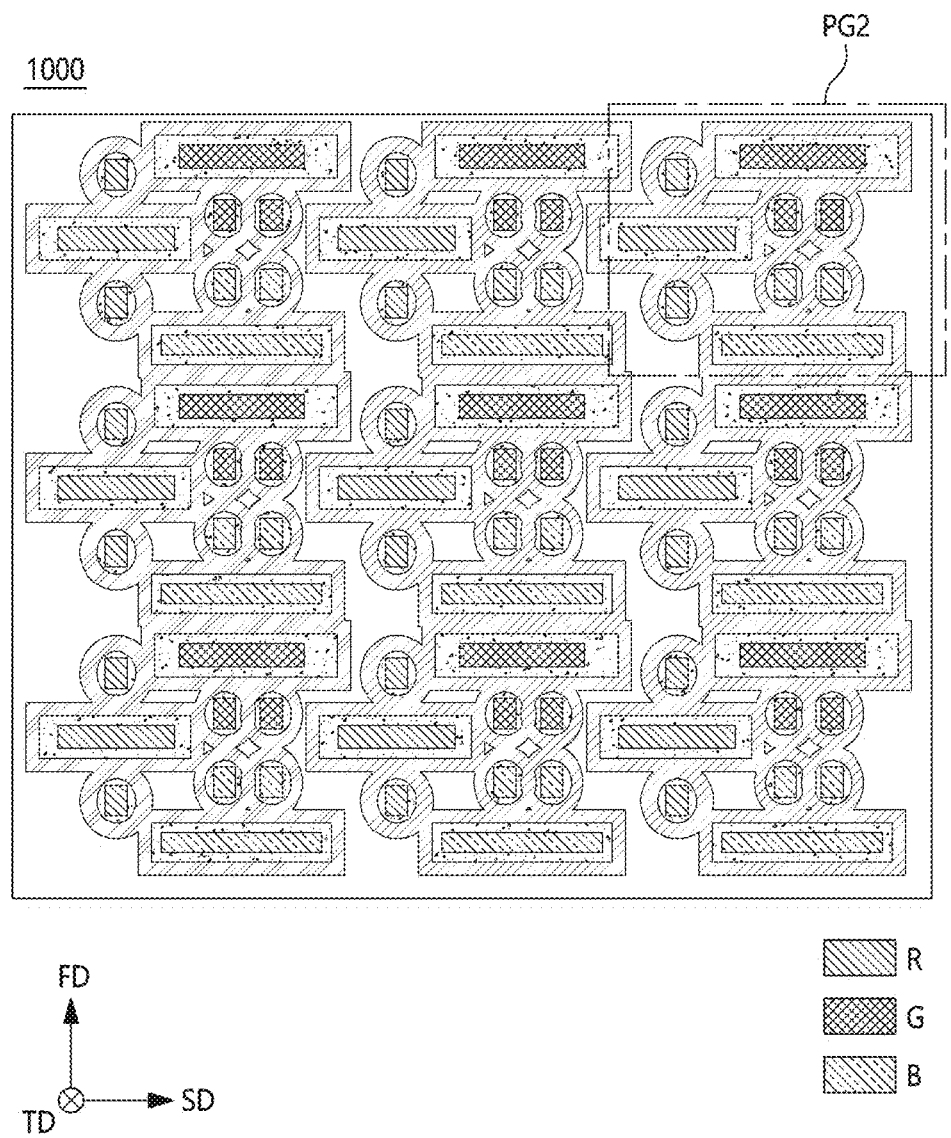
FIG. 3 is a plan view illustrating subpixels arranged in an active area of a display device according to another embodiment of the disclosure.

FIG. 3 is a plan view illustrating subpixels arranged in an active area of a display device according to another embodiment of the disclosure.

Referring to FIG. 3, the display device 1000 of FIG. 2 may further include a concave portion that will be described further with reference to FIG. 5.

When the display device 1000 further includes a concave portion, light efficiency through external light extraction efficiency may be increased and the viewing angle luminance may be enhanced.

Figure 4:
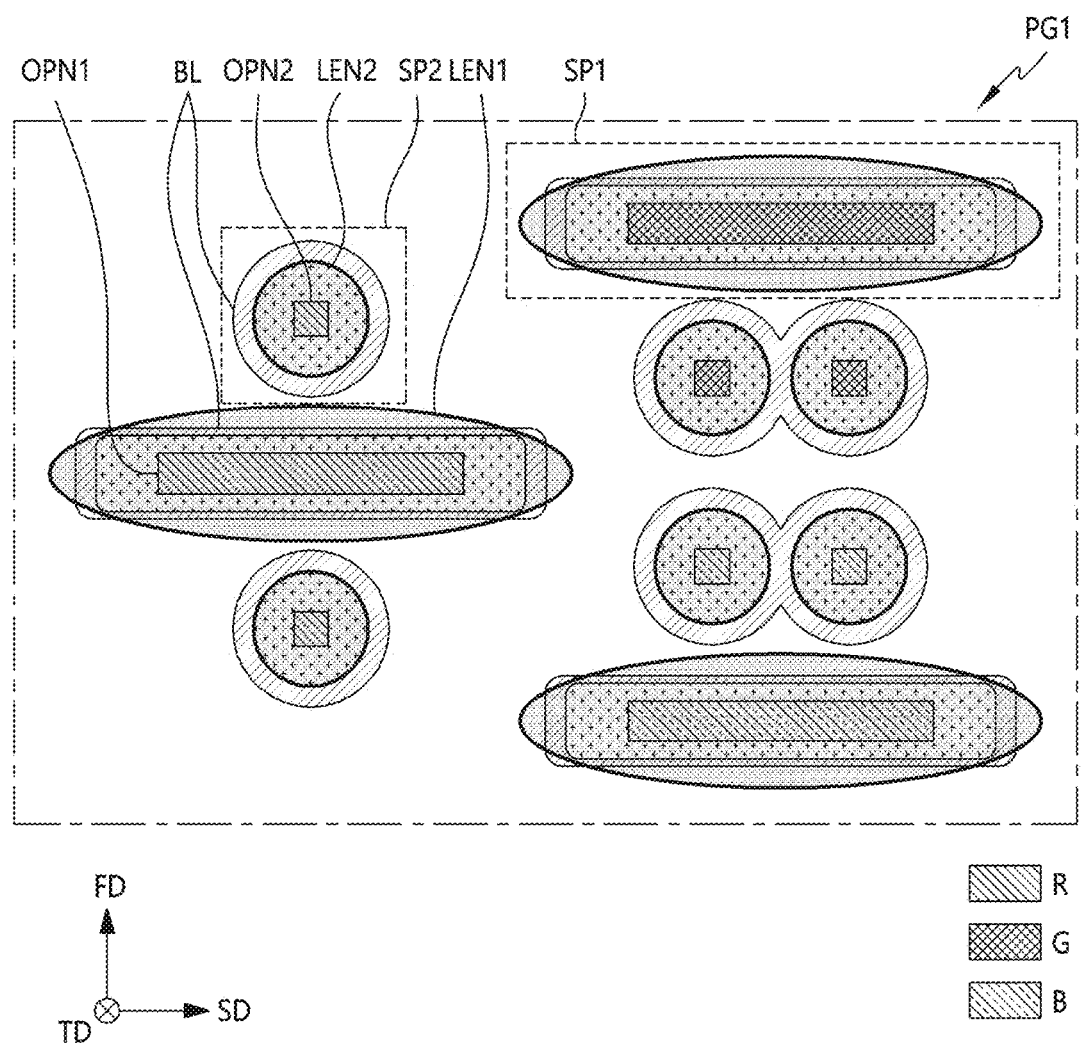
FIG. 4 is an enlarged plan view of area PG1 of FIG. 2.

FIG. 4 is an enlarged plan view of area PG1 of FIG. 2.

Referring to FIG. 4, the first pixel group PG1 may include a plurality of first subpixels SP1 and a plurality of second subpixels SP2. Although only one first subpixel SP1 and one second subpixel SP2 is labeled with a reference number in FIG. 4, it is to be appreciated that each of the illustrated subpixels SP1, SP2 with a similar shape and arrangement may have the same or similar features to the labeled subpixels SP1, SP2.

The first subpixel SP1 and the second subpixel SP2 may include opening areas OPN1 and OPN2, which may also be referred to herein as openings OPN1, OPN2.

The opening areas OPN1 and OPN2 may be referred to as a first opening area OPN1 and a second opening area OPN2, respectively.

The light emitting areas of the subpixels SP1 and SP2 may be defined by the opening areas OPN1 and OPN2.

The light emitting areas of the subpixels SP1 and SP2 may be substantially the same as the opening areas OPN1 and OPN2. As shown in FIG. 2, the first subpixels SP1 may generally be larger pixels with larger opening areas OPN1 than the second subpixels SP2 with smaller opening areas OPN2.

In the disclosure, when A is substantially the same as B, it may mean that A and B are generally regarded as the same taking into account small differences due to processing errors or manufacturing tolerances.

The subpixels SP1 and SP2, respectively, may include lens units LEN1 and LEN2 corresponding to the opening areas OPN1 and OPN2. The lens units LEN1, LEN2 may also be referred to herein as lenses LEN1, LEN2.

The lens units LEN1 and LEN2 are to enhance light efficiency by changing the optical path of the light emitted from the opening areas OPN1 and OPN2. The lens units LEN1 and LEN2 are positioned to correspond to the opening areas OPN1 and OPN2, and their shapes may also correspond to the shapes of the opening areas OPN1 and OPN2, but are not necessarily limited to the shapes of the opening areas, and various shapes may be possible. For example, in FIG. 4, the lenses LEN1, LEN2 may overlap and completely cover the opening areas OPN1, OPN2, but generally have a larger size and a different shape (circular or ovular) than the corresponding opening areas OPN1, OPN2 (rectangular or square). Many other configurations are contemplated herein.

Some of the subpixels SP1 and SP2 may emit light of different colors.

For example, the first subpixels SP1 may include a red subpixel R, a green subpixel G, and a blue subpixel B, and may emit red light, green light, and blue light, respectively.

For example, the second subpixels SP2 may include a red subpixel R, a green subpixel G, and a blue subpixel B, and may emit red light, green light, and blue light, respectively.

The arrangements of the subpixels SP1 and SP2 and the red subpixel R, the green subpixel G, and the blue subpixel B illustrated in the plan view of FIG. 4 are non-limiting examples, and are not necessarily limited thereto, but the pixels may be arranged in various combinations.

The subpixels emitting light of different colors may include opening areas having different areas.

For example, the area of the opening area emitting blue light may be the largest, and the area of the opening area emitting red light may be the smallest.

This is because the device characteristics of the light emitting elements included in the subpixels emitting light of different colors may be different from each other.

However, the disclosure is not necessarily limited thereto, and the areas of the opening areas OPN1 and OPN2 may be the same regardless of colors as in the plan view of FIG. 4.

Figure 5:
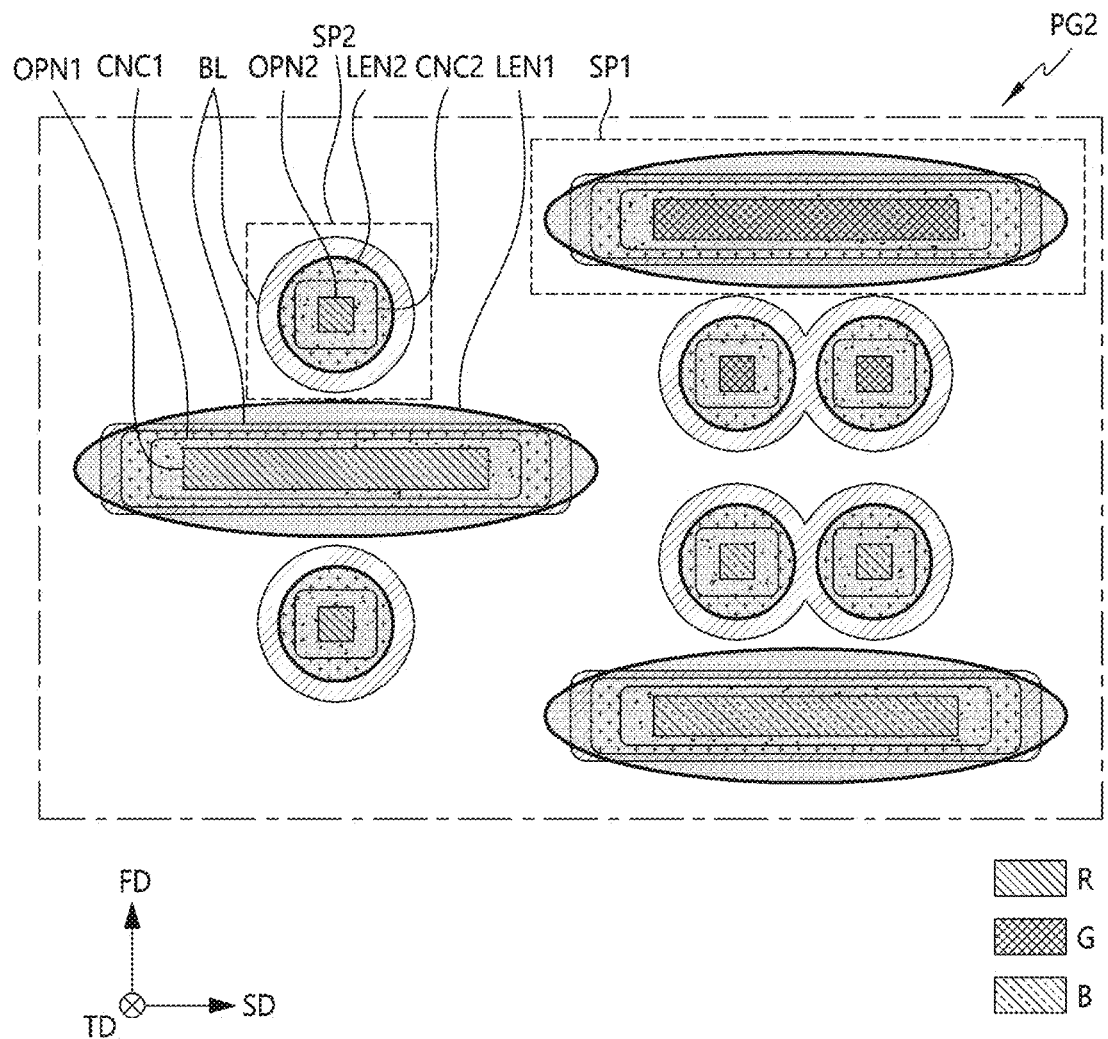
FIG. 5 is an enlarged plan view of area PG2 of FIG. 3.

FIG. 5 is an enlarged plan view of area PG2 of FIG. 3.

Referring to FIG. 5, the display device according to an embodiment of the disclosure may further include concave portions CNC1 and CNC2 in the subpixels SP1 and SP2 of FIG. 4.

The concave portions CNC1 and CNC2 may be referred to as a first concave portion CNC1 and a second concave portion CNC2, respectively. In an embodiment, the concave portions CNC1, CNC2 are depressions, cavities, apertures, or other like structures in a surface of the display device 1000. The concave portions CNC2 may be narrower than the concave portions CNC1.

A light emitting element that emits light may be positioned inside the concave portions CNC1 and CNC2.

The lens units LEN1 and LEN2 may be positioned to correspond to the concave portions CNC1 and CNC2.

Specifically, the first lens unit LEN1 may be positioned to correspond to the first concave portion CNC1, and the second lens unit LEN2 may be positioned to correspond to the second concave portion CNC2. As illustrated, the concave portions CNC1, CNC2 may have a size that is generally larger than a size of the corresponding opening areas OPN1, OPN2, but again smaller than a size of the lenses LEN1, LEN2 such that the lenses LEN1, LEN2 overlap and cover the concave portions CNC1, CNC2. Many other configurations are contemplated and the above are merely non-limiting examples.

Figure 6:
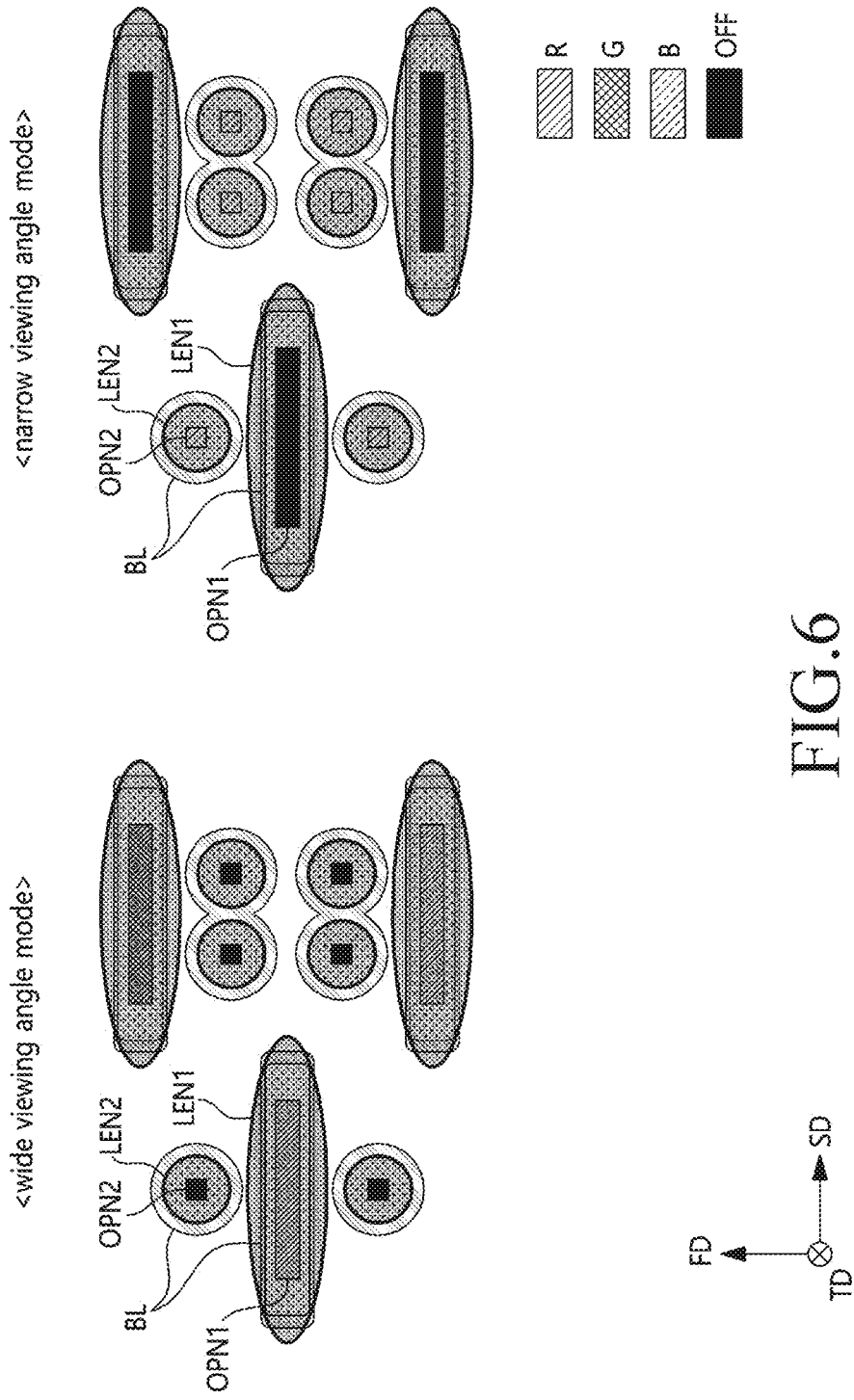
FIG. 6 is a plan view illustrating an operation scheme of a display device according to a mode in a mode-switchable privacy mode in a display device according to an embodiment of the disclosure.

FIG. 6 is a plan view illustrating an operation scheme of a mode-switchable display device that is capable of switching between a wide viewing angle mode and a narrow viewing angle mode or privacy mode according to an embodiment of the disclosure.

Specifically, FIG. 6 is a plan view illustrating an operation scheme of the display device in FIGS. 4 and 5.

Referring to FIG. 6 with continuing reference to FIG. 4, a wide viewing angle mode and a narrow viewing angle mode may be switched according to user convenience.

In the wide viewing angle mode, in order to secure a wide viewing angle, light may be emitted from the light emitting area of the first opening area OPN1 having a large opening area, and light may not be emitted from the light emitting area of the second opening area OPN2 having a smaller area than the first opening area OPN1, which may correspond to operating the light emitting elements of the first subpixel SP1 to output light through the first opening area OPN2 and the light emitting elements of the second subpixel SP2 being OFF or not in operation so that light is not emitted through the second opening area OPN2.

For a narrow viewing angle in the narrow viewing angle mode, light may not be emitted from the light emitting area of the first opening area OPN1 having a large opening area (OFF), and light may be emitted from the light emitting area of the second opening area OPN2 having a smaller area than the first opening area OPN1. Thus, the narrow viewing angle mode may generally be the inverse of the wide viewing angle mode.

When the display device 1000 is installed in the front of the passenger seat, in the wide viewing angle mode, visibility may be secured for not only the passenger sitting in the passenger seat but also the driver sitting in the driver's seat.

Further, in the narrow viewing angle mode, visibility is secured for the passenger sitting in the passenger seat, but not for the driver sitting in the driver's seat, so that privacy may be protected for the passenger sitting in the passenger seat and distraction of the driver can be reduced or avoided.

Figure 7A:
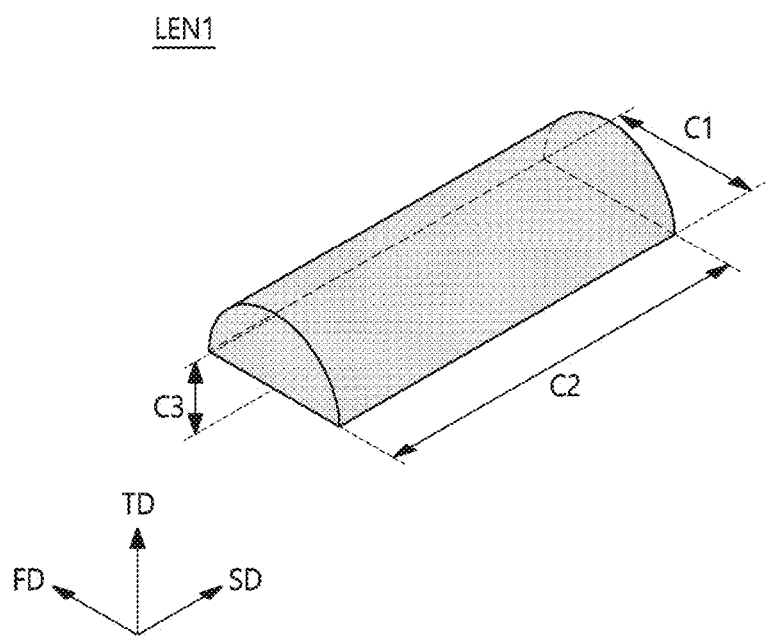
FIG. 7A is a perspective view illustrating a first lens of a display device according to an embodiment of the disclosure.
Figure 7B:
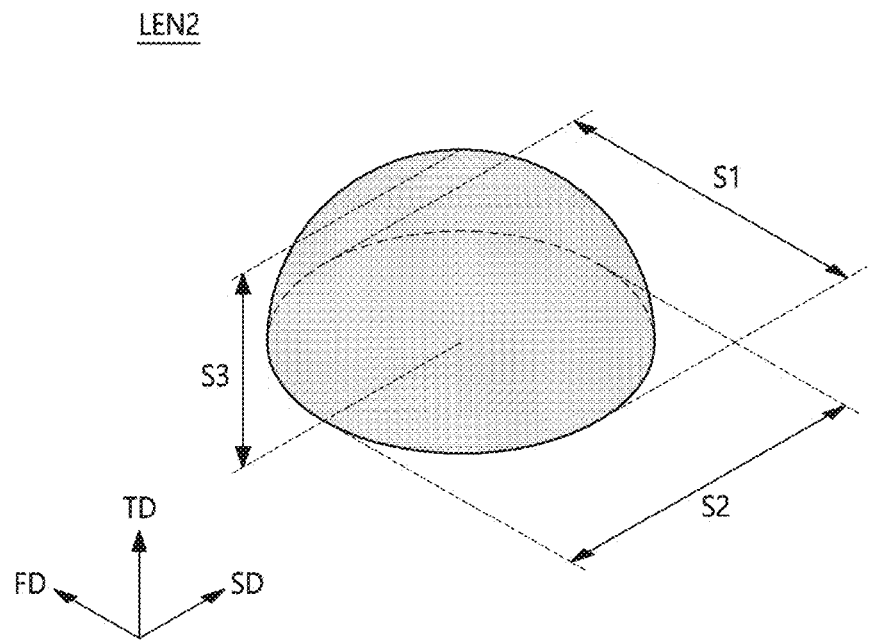
FIG. 7B is a perspective view illustrating a second lens of a display device according to an embodiment of the disclosure.

FIGS. 7A and 7B are perspective views illustrating a first lens unit LEN1 and a second lens unit LEN2, respectively, of a display device according to an embodiment of the disclosure.

Referring to FIG. 7A, the first lens unit LEN1 may have a semi-cylindrical shape having a diameter or width C1 in a first direction FD, a diameter or length C2 in a second direction SD, and a height C3 in the third direction TD. In an embodiment, the semi-cylindrical shape of the first lens unit LEN1 may correspond to a cylinder that is cut in half vertically along an axis through a center of the cylinder such that the resulting semi-cylindrical shape is half of a cylinder cut along a longest direction, as above.

The diameter C2 of the first lens unit LEN1 in the second direction SD may be larger than the diameter C1 of the first direction FD to correspond to the generally rectangular shape of the first opening area OPN1.

Although the shape of the first lens unit LEN1 of FIG. 7A is a semi-cylindrical shape, this is illustrative and is not necessarily limited to such a shape, and various shapes may be possible depending on the shape of the opening area OPN1 of the first subpixel SP1.

For example, the height C3 of the third direction TD may be half the diameter C1 in the first direction FD, but is not necessarily limited thereto, and may be larger than or less than half the diameter C1 in the first direction FD.

Referring to FIG. 7B, the second lens unit LEN2 may have a hemispherical shape having a diameter S1 in the first direction FD, a diameter S2 in the second direction SD, and a height S3 in the third direction TD.

The diameter S2 in the second direction SD and the diameter S1 in the first direction FD may generally be the same to provide the second lens unit LEN2 with a hemispherical shape that generally corresponds to the shape of the circular second opening area OPN2. Other configurations are contemplated herein.

Although the shape of the second lens unit LEN2 of FIG. 7B is a hemispherical shape, this is illustrative and is not necessarily limited to such a shape, and various shapes may be possible depending on the shape of the opening area OPN2 of the second subpixel SP2.

For example, the height S3 in the third direction TD may be half the diameter S1 in the first direction FD, but is not necessarily limited thereto, and may be larger than or less than half the diameter S1 in the first direction FD. In an embodiment, both the shape of the opening area OPN1, OPN2 as well as optical characteristics of the lens units LEN1, LEN2 assist with enabling the wide viewing angle mode and the narrow viewing angle mode. For example, the wider or longer first opening area OPN1 and corresponding longer lens unit LEN1 enable wide distribution of light. The smaller and narrower second opening area OPN2 produces more targeted light, that is further concentrated by the overall hemispherical shape of the second lens unit LEN2 to produce a targeted and narrow output beam of light.

Figure 8A:
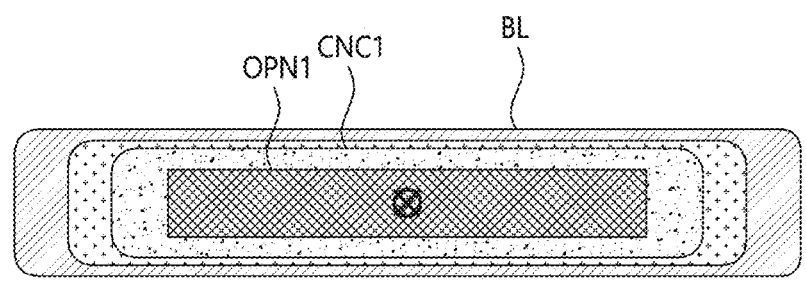
FIG. 8A is an enlarged plan view of an embodiment of SP1 of FIG. 5.
Figure 8A:
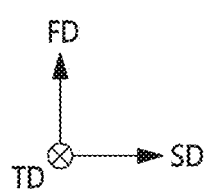
Figure 8B:
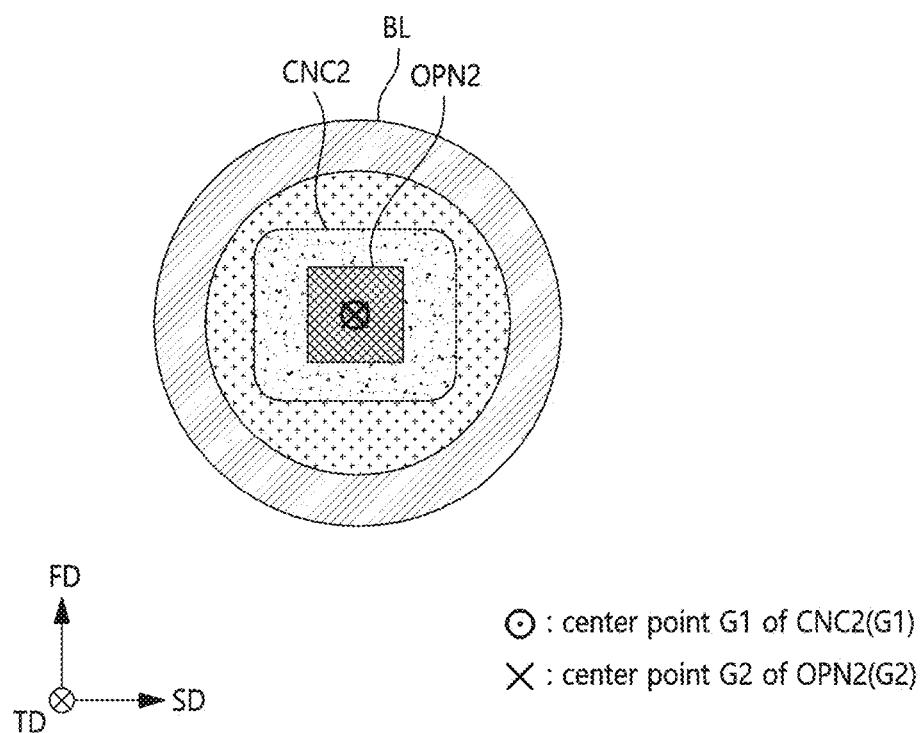
FIG. 8B is an enlarged plan view of an embodiment of SP2 of FIG. 5.

FIGS. 8A and 8B are enlarged plan views illustrating an embodiment of the subpixels SP1 and SP2 of FIG. 5.

In FIGS. 8A and 8B, the first and second lens units (not shown) are omitted to avoid obscuring details of the first and second subpixels SP1, SP2.

Referring to FIG. 8A, the first subpixel SP1 may include the first opening area OPN1 through the bank layer, the first concave portion CNC1 surrounding the first opening area OPN1, and a barrier layer BL positioned in a non-opening area of the bank layer and positioned on the insulation layer.

In the first subpixel SP1 of FIG. 8A The center point G1 of the first concave portion CNC1 and the center point G2 of the first opening area OPN1 may overlap each other. In an embodiment, the center points G1, G2 are directly on top of one another, meaning that are aligned and centered relative to the first subpixel SP1.

In the disclosure, the center points G1 and G2 may refer to geometric centers of areas of a selected size and shape when viewed on a plane defined in a first direction FD and a second direction SD orthogonal to the first direction FD.

The geometric center may be positioned not only inside but also outside the area, or may be positioned at the boundary of the area.

For example, the center point G2 of the first opening area OPN1 of FIG. 8A may refer to an intersection point of two diagonal lines connecting opposite vertices of the first opening area.

In this case, the center point G2 of the first opening area OPN1 is positioned inside the first opening area OPN1.

For example, the center point G1 of the first concave portion CNC1 of FIG. 8A may refer to an intersection point of two diagonal lines connecting opposite vertices of a virtual rectangle inscribed to the first concave portion CNC1.

In this case, the center point G1 of the first concave portion CNC1 is positioned inside the area of the first concave portion CNC1.

Referring to FIG. 8B, in the second subpixel SP2, the center point G1 of the second concave portion CNC2 and the center point G2 of the second opening area OPN2 may overlap each other and may generally have the same arrangement as the center points G1, G2 described above in FIG. 8A.

The barrier layer BL of FIG. 8B may be substantially the same as the barrier layer BL described with reference to FIG. 8A.

Figure 9A:
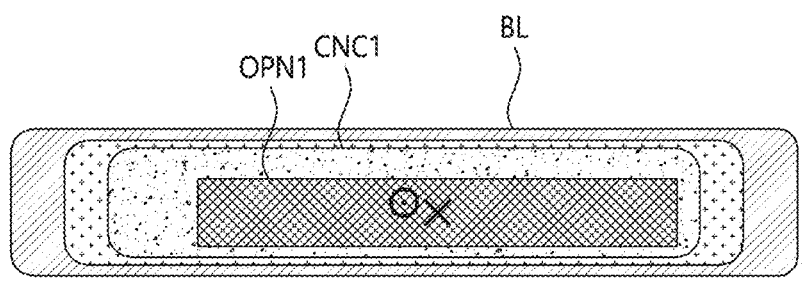
FIG. 9A is an enlarged plan view of another embodiment of SP1 of FIG. 5.
Figure 9A:
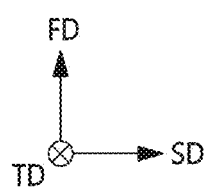
Figure 9B:
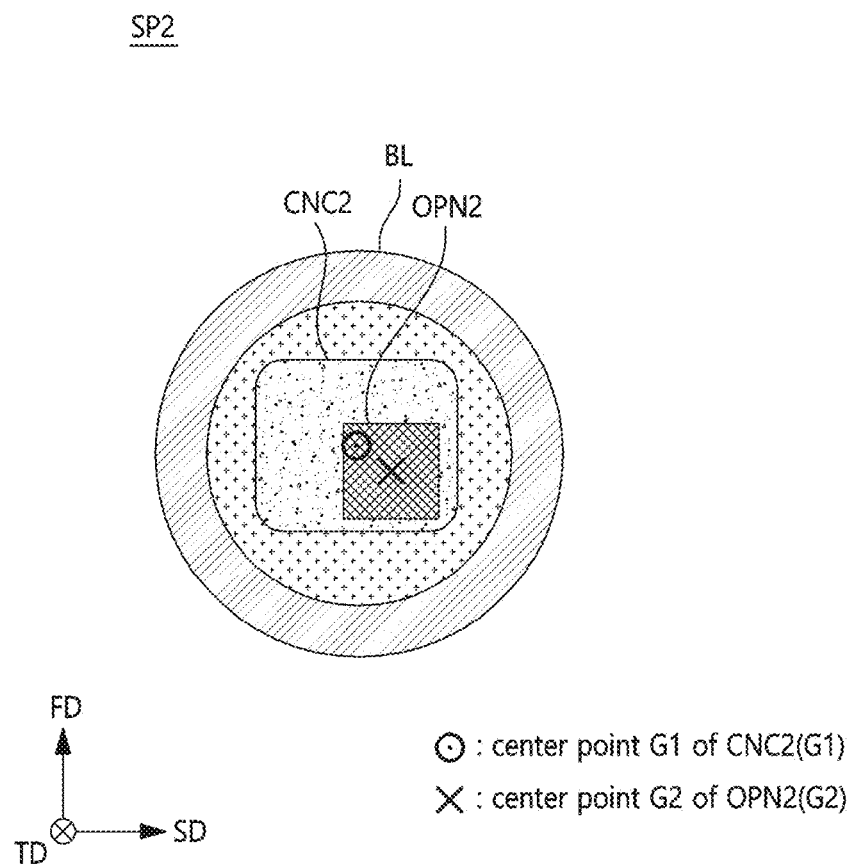
FIG. 9B is an enlarged plan view of another embodiment of SP2 of FIG. 5.

FIGS. 9A and 9B are enlarged plan views illustrating another embodiment of the subpixels SP1 and SP2 of FIG. 5.

In FIGS. 9A and 9B, the first and second lens units (not shown) are likewise omitted.

With reference to FIGS. 9A and 9B, and continuing reference to FIG. 5, the opening areas OPN1 and OPN2, the concave portions CNC1 and CNC2, and the barrier layer BL in FIGS. 9A and 9B may be substantially the same as the opening areas OPN1 and OPN2, the concave portions CNC1 and CNC2, and the barrier layer BL described with reference to FIGS. 8A and 8B.

Referring to FIG. 9A, in the first subpixel SP1, the center point G1 of the first concave portion CNC1 and the center point G2 of the first opening area OPN1 may not overlap each other.

Referring to FIG. 9B, in the second subpixel SP2, the center point G1 of the second concave portion CNC2 and the center point G2 of the second opening area OPN2 may not overlap each other.

As illustrated in FIGS. 9A and 9B, when the center point G1 of the concave portion CNC1, CNC2 and the center point G2 of the opening area OPN1, OPN2 do not overlap each other in the subpixels SP1 and SP2, when viewed on a plane defined in the first direction FD and the second direction SD orthogonal to the first direction FD, an asymmetric separation distance of the concave portions CNC1, CNC2 may be formed according to any direction, so that viewing angle may be adjusted according to user convenience.

Figure 10A:
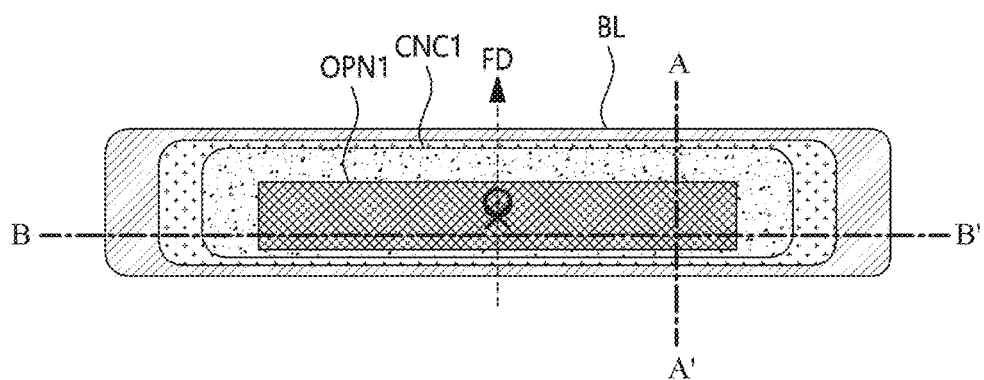
FIG. 10A is an enlarged plan view of another embodiment of SP1 of FIG. 5.
Figure 10A:
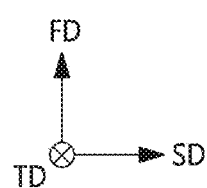
Figure 10B:
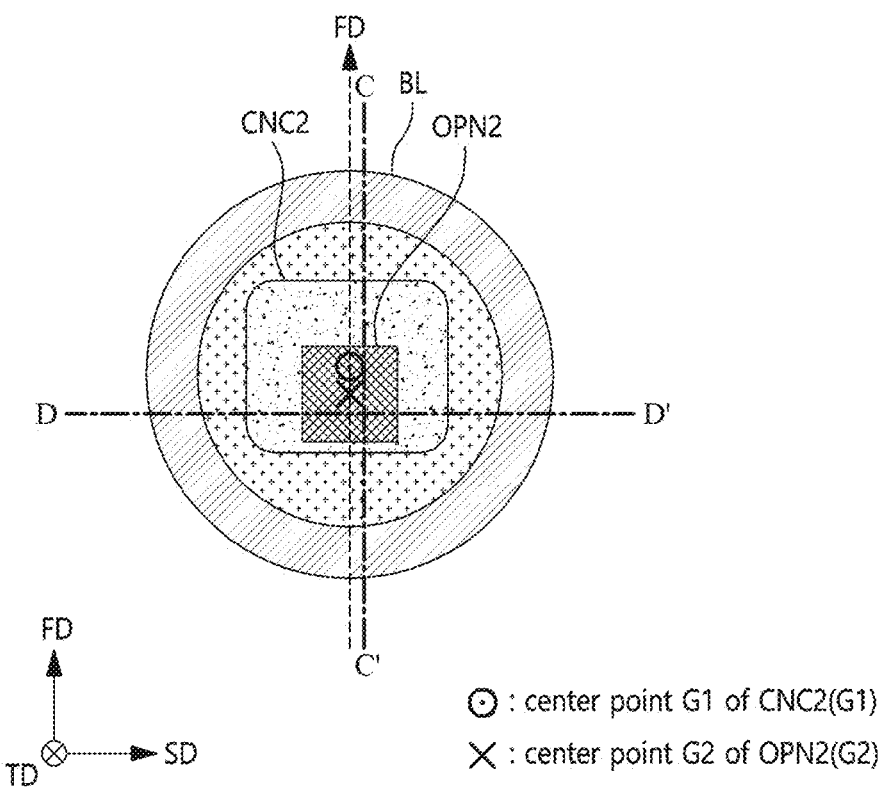
FIG. 10B is an enlarged plan view of another embodiment of SP2 of FIG. 5.

FIGS. 10A and 10B are enlarged plan views illustrating another embodiment of the subpixels SP1 and SP2 of FIG. 5.

In FIGS. 10A and 10B, the first and second lens units (not shown) are likewise omitted.

The opening areas OPN1 and OPN2, the concave portions CNC1 and CNC2, and the barrier layer BL in FIGS. 10A and 10B may be substantially the same as the opening areas OPN1 and OPN2, the concave portions CNC1 and CNC2, and the barrier layer BL described with reference to FIGS. 8A and 8B.

Referring to FIG. 10A, when viewed on a plane defined in the first direction FD and the second direction SD orthogonal to the first direction FD like the first subpixel SP1, the distance between two points where a virtual straight line (not shown) passing through the center point G1 of the area of the first concave portion CNC1 and parallel to the second direction SD meets the boundary of the area of the first concave portion CNC1 may be longer than the distance between two points where a virtual straight line (dashed arrow) passing through the center point G1 of the area of the first concave portion CNC1 and parallel to the first direction FD meets the boundary of the area of the first concave portion CNC1, and the direction (dashed arrow) of the straight line passing through the center point G1 of the area of the first concave portion CNC1 and the center point G2 of the first opening area OPN1 may be the first direction FD.

Referring to FIG. 10B, when viewed on a plane defined in the first direction FD and the second direction SD orthogonal to the first direction FD like the second subpixel SP2, the distance between two points where a virtual straight line (not shown) passing through the center point G1 of the area of the second concave portion CNC2 and parallel to the second direction SD meets the boundary of the area of the second concave portion CNC2 may be equal to the distance between two points where a virtual straight line (dashed arrow) passing through the center point G1 of the area of the second concave portion CNC2 and parallel to the first direction FD meets the boundary of the area of the second concave portion CNC2, and the direction (dashed arrow) of the straight line passing through the center point G1 of the area of the second concave portion CNC2 and the center point G2 of the second opening area OPN2 may be the first direction FD.

As illustrated in FIGS. 10A and 10B, when the direction of the straight line passing through the center point G1 of the concave portions CNC1 and CNC2 and the center point G2 of the opening areas OPN1 and OPN2 in each of the subpixels SP1 and SP2 is the first direction FD when viewed in a plane defined as the first direction FD and the second direction SD orthogonal to the first direction FD, an asymmetric separation distance in the first direction FD may be formed to enhance the viewing angle luminance in the upper direction or lower direction.

Preferably, in order to secure the luminance of the viewing angle in the upper direction of the display device 1000 when the display device 1000 is positioned lower than the eye level of the driver sitting in the driver's seat, an asymmetrical separation distance in the first direction FD of the concave portion may be formed to enhance the viewing angle luminance in the upper direction.

Figure 11:
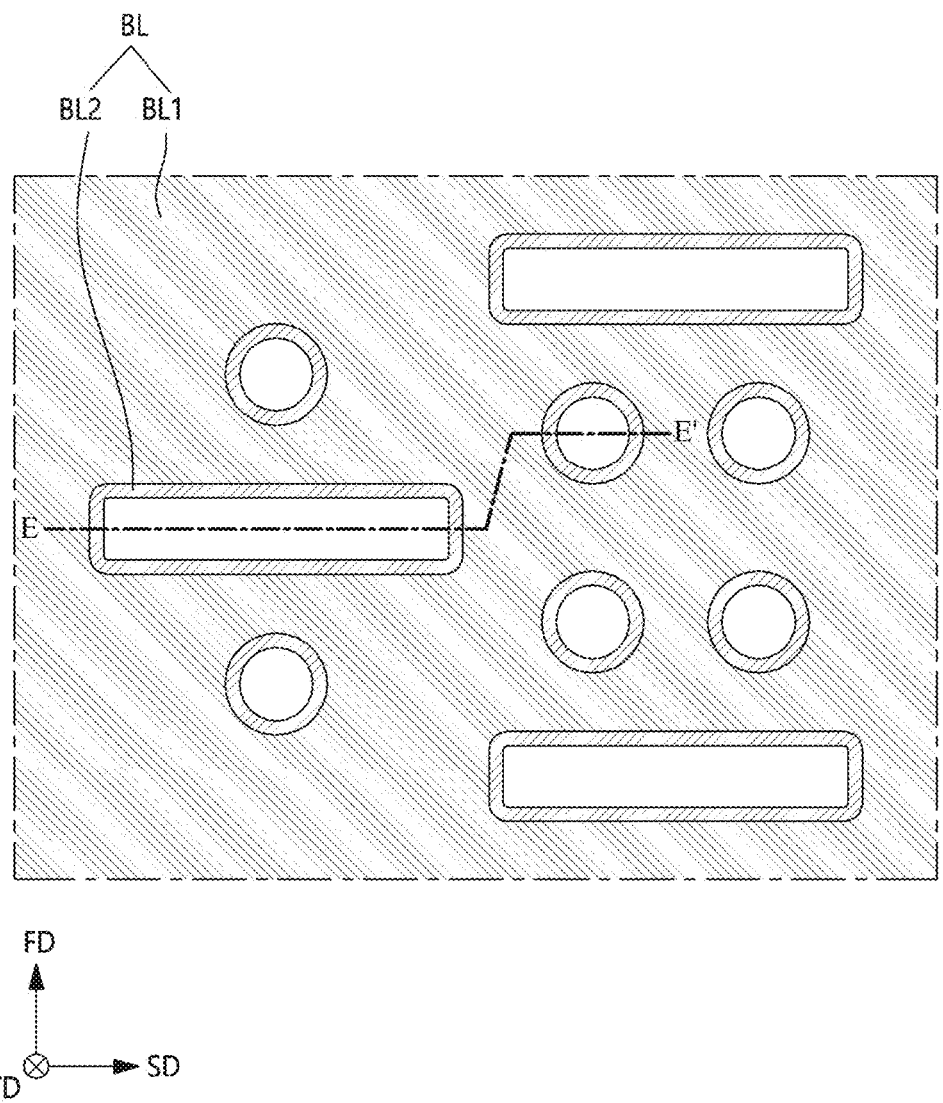
FIG. 11 is a plan view illustrating a barrier layer of a display device according to embodiments of the disclosure.

FIG. 11 is a plan view illustrating a barrier layer BL of a display device 1000 according to embodiments of the disclosure.

Referring to FIG. 11, the barrier layer BL may include a first barrier layer BL1 on an insulation layer (not shown) with respect to the third direction TD and a second barrier layer BL2 positioned on the first barrier layer.

The first barrier layer BL1 and the second barrier layer BL2 of FIG. 11 may overlap each other when viewed on a plane defined in the first direction FD and the second direction SD orthogonal to the first direction FD.

The barrier layer BL of FIG. 11 may be substantially the same as the barrier layer BL described with reference to FIGS. 2 to 10B.

Specifically, the shape of the barrier layer BL of FIG. 11 may be applied to the barrier layer BL described with reference to FIGS. 2 to 10B.

However, the barrier layer BL is not necessarily limited to the shape of the barrier layer BL of FIG. 11 and may be designed in various shapes.

Figure 12:
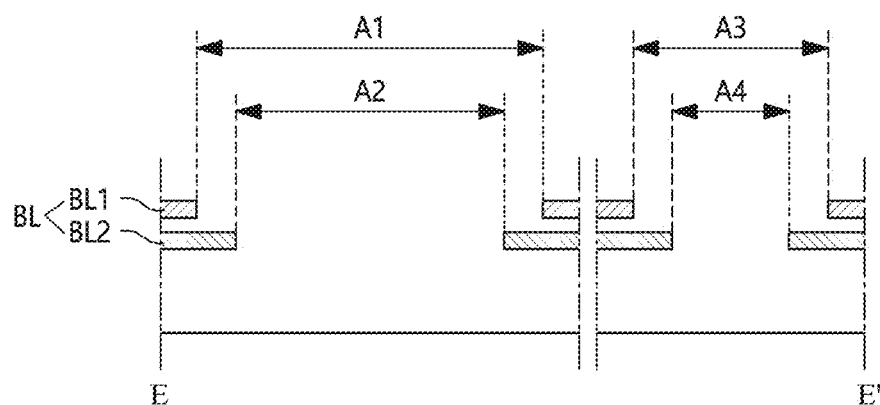
FIG. 12 is a cross-sectional view taken along line E-E' of FIG. 11.
Figure 12:
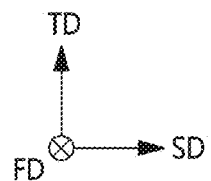

FIG. 12 is a cross-sectional view taken along line E-E' of FIG. 11.

Referring to FIG. 12, the first barrier layer BL1 may have an opening area having widths of A1 and A3, and the second barrier layer BL2 may have an opening area having widths of A2 and A4.

For example, the opening area of the first barrier layer BL1 may be wider than the opening area of the second barrier layer BL2.

In other words, the widths A1 and A3 of the opening area of the first barrier layer BL1 may be larger than the widths A2 and A4, respectively, of the opening area of the second barrier layer BL2. Accordingly, the barrier layer BL may generally be a multi-layer stack including the first and second barrier layers BL1, BL2 extending across an entirety of the barrier layer BL, except for the opening areas. At the opening areas, the opening area in the first barrier layer BL1 may be larger than the opening area in the second barrier layer BL2 to create a step-down configuration in some embodiments.

As another example, the size of the opening area of the first barrier layer BL1 and the size of the opening area of the second barrier layer BL2 may be the same.

In other words, the widths A1 and A3 of the opening area of the first barrier layer BL1 may be the same as the widths A2 and A4, respectively, of the opening area of the second barrier layer BL2.

In FIG. 12, the width of the opening area has been described with respect to the second direction SD, but is not limited thereto, and may be equally applied to a width in the first direction FD or any direction on a plane defined in the first direction FD and the second direction SD.

Figure 13:
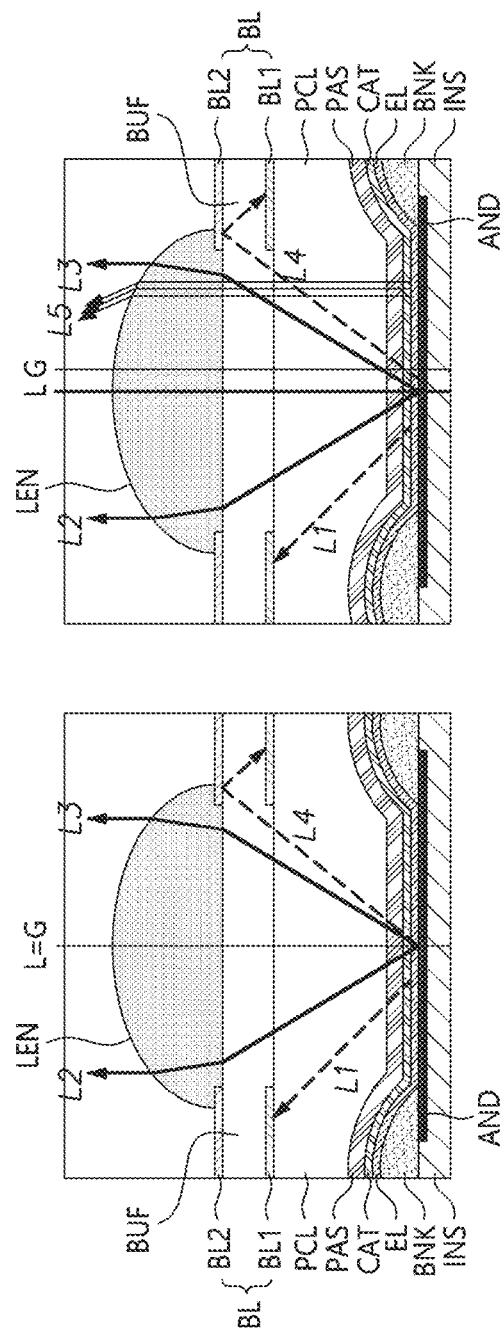
FIG. 13 is a cross-sectional view illustrating a structure of a display device according to embodiments of the disclosure.

FIG. 13 is a cross-sectional view illustrating a structure of a display device according to embodiments of the disclosure.

Referring to FIG. 13, the subpixel may include an insulation layer INS, a first electrode layer AND on the insulation layer INS, a bank layer BNK on the insulation layer INS and the first electrode layer AND, a light emitting layer EL on the first electrode layer AND and the bank layer BNK, a second electrode layer CAT on the light emitting layer EL, and a passivation layer PAS on the second electrode layer CAT in a multi-layer stack.

The subpixel of FIG. 13 may further include a barrier layer BL on a non-opening area of the bank layer and the insulation layer INS.

The barrier layer BL may include a first barrier layer BL1 on the insulation layer INS and a second barrier layer BL2 on the first barrier layer.

In the subpixel of FIG. 13, the lens unit LEN may be disposed to correspond to the opening area of the barrier layer BL.

The subpixel of FIG. 13 may include an encapsulation layer PCL between the passivation layer PAS and the first barrier layer BL1.

The subpixel of FIG. 13 may include a buffer layer BUF between the lens unit LEN and the encapsulation layer PCL.

The insulation layer INS may be multiple layers.

For example, the insulation layer INS may be a double layer, or may include more or less layers.

The encapsulation layer PCL may be multiple layers.

For example, the encapsulation layer PCL may be a first encapsulation layer, a second encapsulation layer, and a third encapsulation layer, or may include more or less layers. The subpixel is generally operable to emit light that is represented by arrows L1-L5.

The lens unit LEN may effectively extract a portion of the light L1, L2, L3, L4, and L5 emitted from the light emitting layer EL, such as light L2 and L3.

However, some light L1 and L4 may not reach the lens unit LEN but may be blocked or reflected by the barrier layer BL so that a portion of the light may not be extracted, thereby reducing luminance output to the user.

This may be caused by the presence or absence of the barrier layer BL.

Further, the center line G of the opening area of the bank layer BNK may be offset from the center line L of the lens unit. For example, for some light L5, the center line G of the opening area of the bank layer BNK may be moved to the right with respect to the center line L of the lens unit, which enables rapid change in the luminance according to the selected viewing angle mode.

Figure 14A:
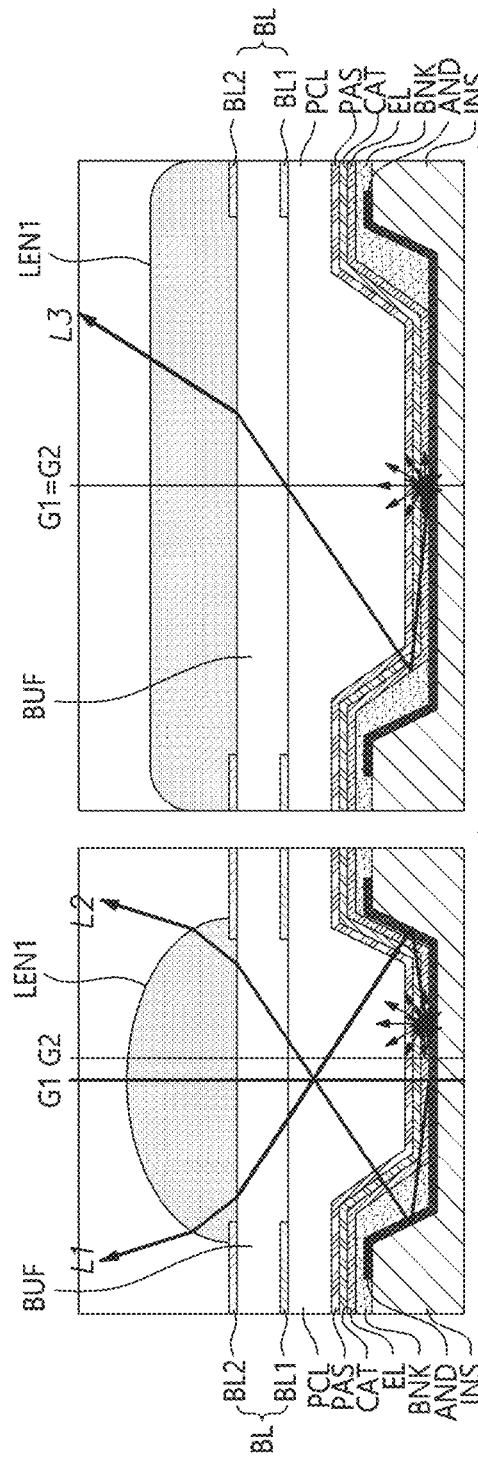
FIG. 14A is a cross-sectional view taken along line A-A' and line B-B' of FIG. 10A.

FIG. 14A is a cross-sectional view taken along line A-A' and line B-B' of FIG. 10A.

Referring to FIG. 14A, the insulation layer INS, the first electrode layer AND, the bank layer BNK, the light emitting layer EL, the second electrode layer CAT, the passivation layer PAS, the encapsulation layer PCL, the barrier layer BL, and the buffer layer BUF of FIG. 14A may be substantially the same as the insulation layer INS, the first electrode layer AND, the bank layer BNK, the light emitting layer EL, the second electrode layer CAT, the passivation layer PAS, the encapsulation layer PCL, the barrier layer BL, and the buffer layer BUF described with reference to FIG. 13.

The barrier layer BL may be multiple layers.

For example, the barrier layer BL may include a first barrier layer BL1 and a second barrier layer BL2.

At least one of the first barrier layer BL1 and the second barrier layer BL2 may be a sensor.

For example, the first barrier layer BL1 may be a sensor, and the second barrier layer BL2 may be a black matrix, but the disclosure is not limited thereto.

The light L1, L2, and L3 emitted from the light emitting layer EL may be extracted by the lens unit LEN1.

As the center line G2 of the opening area OPN1 moves in the first direction FD with respect to the center line G1 of the concave portion CNC1, the amount of light extracted from L1 having a larger or greater emission angle than L2 increases.

Specifically, as the center line G2 of the opening area OPN1 moves in the first direction FD with respect to the center line G1 of the concave portion CNC1, the distance from the center line G2 of the opening area OPN1 of the bank layer BNK to the inclined portion of the concave portion decreases, and thus the amount of light extracted having an emission angle of 60 degrees to 70 degrees as in L1 may be increased. In other words, changing the position of the opening area OPN1 of the bank layer BNK relative to the center of the concave portion CNC1 varies the amount of light that is emitted through the opening area OPN1 because light with a certain emission angle corresponding to the offset between the opening area OPN1 and the concave portion CNC1 will be emitted, while light without the certain emission angle will be reflected back toward the concave portion CNC1, as shown in FIG. 13, for example. When light is emitted with an emission angle of 60 degrees to 70 degrees, such as for light L1, it is advantageous to offset the center line G2 of the opening area OPN1 relative to the center line G1 of the concave portion CNC1 to assist with capturing or emitting additional light L1.

Figure 14B:
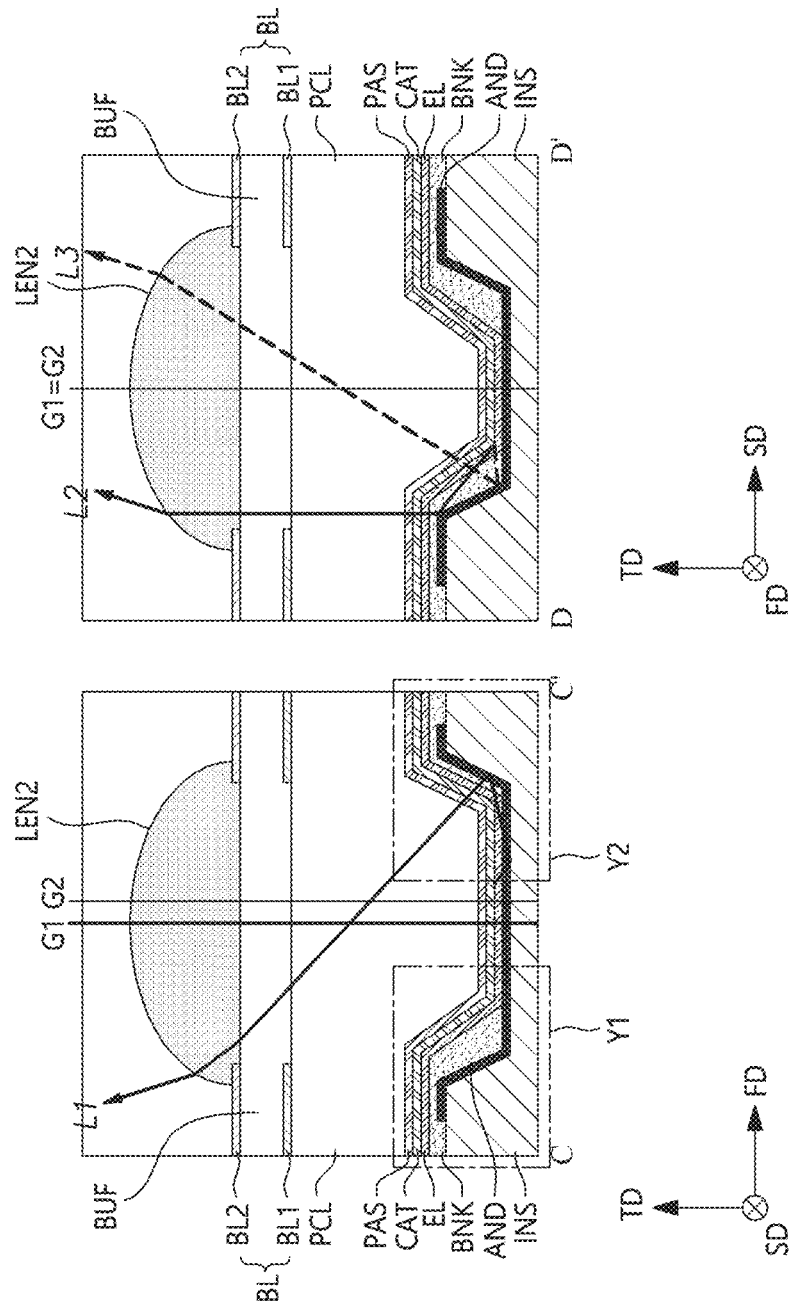
FIG. 14B is a cross-sectional view taken along line C-C' and line D-D' of FIG. 10B.

FIG. 14B is a cross-sectional view taken along line C-C' and line D-D' of FIG. 10B.

Referring to FIG. 14B, the insulation layer INS, the first electrode layer AND, the bank layer BNK, the light emitting layer EL, the second electrode layer CAT, the passivation layer PAS, the encapsulation layer PCL, the barrier layer BL, and the buffer layer BUF of FIG. 14B may be substantially the same as the insulation layer INS, the first electrode layer AND, the bank layer BNK, the light emitting layer EL, the second electrode layer CAT, the passivation layer PAS, the encapsulation layer PCL, the barrier layer BL, and the buffer layer BUF described with reference to FIG. 13.

Further, the barrier layer BL of FIG. 14B may be multiple layers like the barrier layer BL described with reference to FIG. 14A.

The light L1, L2, and L3 emitted from the light emitting layer EL may be extracted by the lens unit LEN2.

As the center line G2 of the opening area OPN2 moves in the first direction FD with respect to the center line G1 of the concave portion CNC2, the amount of light extracted from L1 having a larger emission angle than L3 increases.

Specifically, as the center line G2 of the opening area OPN2 moves in the first direction FD with respect to the center line G1 of the concave portion CNC2, the distance to the upper surface from the center line of the opening area OPN2 of the bank layer BNK to the inclined portion of the concave portion decreases, and thus the amount of light extracted having an emission angle of 60 degrees to 70 degrees as in L1 may be increased for the same or similar reasons described above with reference to FIG. 14A.

Figure 15:
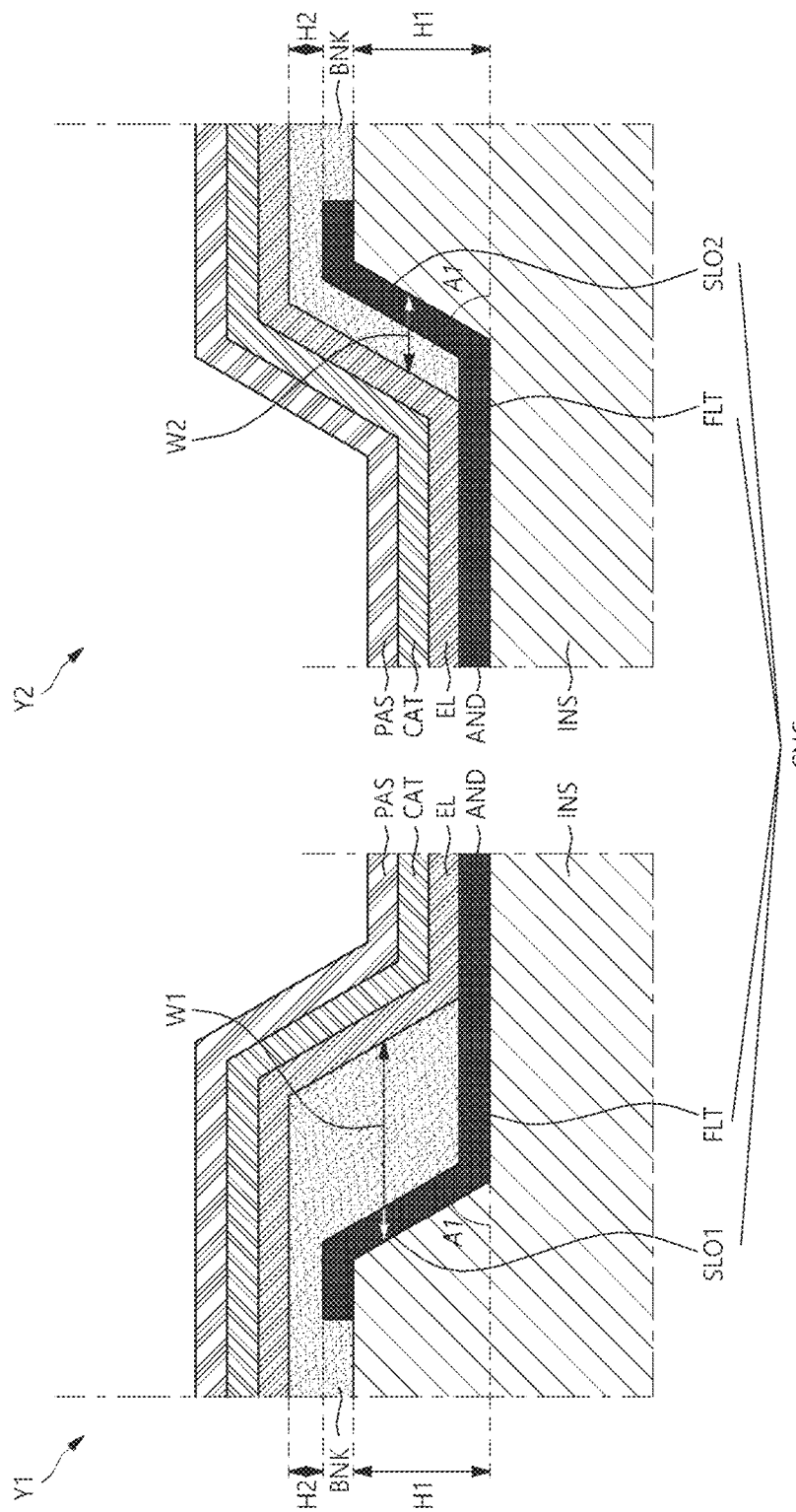
FIG. 15 is an enlarged cross-sectional view illustrating Y1 and Y2 of FIG. 14B.

FIG. 15 is an enlarged cross-sectional view illustrating areas Y1 and Y2 of FIG. 14B.

Referring to FIG. 15, the insulation layer INS, the first electrode layer AND, the bank layer BNK, the light emitting layer EL, the second electrode layer CAT, and the passivation layer PAS of FIG. 15 may be substantially the same as the insulation layer INS, the first electrode layer AND, the bank layer BNK, the light emitting layer EL, the second electrode layer CAT, and the passivation layer PAS described with reference to FIG. 13.

The insulation layer INS may include at least one concave portion CNC and the other layers on the insulation layer INS may generally have a similar shape and arrangement, meaning that they follow the concave portion CNC of the insulation layer INS have a concave arrangement.

The concave portion CNC may include a flat portion FLT and an inclined portion SLO surrounding the flat portion FLT.

The inclined portion SLO may include a first inclined portion SLO1 and a second inclined portion SLO2 facing an upper portion of the subpixel and the first inclined portion SLO1.

When measured in parallel with the upper surface of the subpixel, the distance from the center line G2 of the opening area OPN2 of the bank layer BNK to the upper surface of the first inclined portion SLO1 and the distance from the center line G2 of the opening area OPN2 of the bank layer BNK to the upper surface of the second inclined portion SLO2 may be different.

This may be caused by a difference in the thickness of the bank BNK on certain sides of portions of the subpixel. Specifically, a distance W1 from the upper or front surface of the first inclined portion SLO1 of the insulating layer INS to the upper or front surface of the inclined portion of the bank layer BNK covering the first inclined portion SLO1 (i.e., the surface of the bank layer BNK that interfaces with the emitting layer EL on a left side of the subpixel) may be greater than a distance W2 from the upper or front surface of the second inclined portion SLO2 of the insulating layer INS to the upper or front surface of the inclined portion of the bank layer BNK covering the second inclined portion SLO2 of the concave portion (i.e., the surface of the bank layer BNK that interfaces with the emitting layer EL on a right side of the subpixel). The difference in distances W1, W2 may be implemented by varying a thickness of the bank layer BNK between the first electrode layer AND and the emitting layer EL.

By designing the distance between W1 and W2 to be different, the center point (line) of the concave portion CNC and the center point (line) of the opening area OPN of the bank layer BNK may not overlap or may be offset from each each other, and light extraction efficiency may be enhanced, as described above.

The lower limits of W1 and W2 are not particularly limited, and W1 or W2 may be 0.

The height H1 (or the depth of the concave portion CNC) of the inclined portions SLO1 and SLO2 of the concave portion CNC may be 0.7 um or more, but is not limited thereto.

When the angle between the virtual surface (line) including the flat portion FLT of the concave portion CNC and the virtual surface (line) including the inclined portion SLO is A1, the height H1 of the inclined portions SLO1 and SLO2 means a value obtained by multiplying the length of the inclined portion SLO of the concave portion CNC by sin (A1).

In other words, the equation of H1=length of inclined portion SLO*sin (A1) is established.

The angle A1 may be 27 degrees or more and less than 80 degrees.

When the angle A1 is less than 27 degrees, the light emitted from the light emitting layer EL may not reach the first electrode layer AND disposed on the inclined portion SLO, and may be transferred to another adjacent subpixel, resulting in color mixing, or may be trapped in the display device 1000, failing to be extracted to the outside.

When the angle A1 exceeds 80 degrees, a disconnection may occur in a component, such as the first electrode layer AND disposed on the inclined portion of the insulation layer INS.

Figure 16:
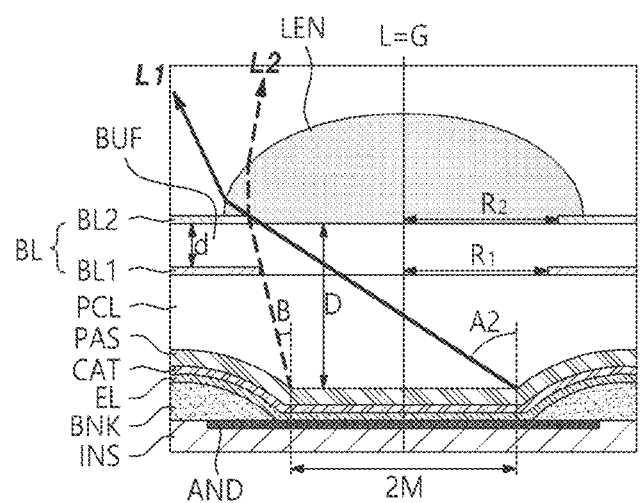
FIG. 16 is a cross-sectional view illustrating a light traveling path of the left view of FIG. 13.

FIG. 16 is a cross-sectional view illustrating a light traveling path of the left view of FIG. 13.

Referring to FIG. 16, the light L1 and L2 emitted from the light emitting layer EL may be extracted by the lens unit LEN.

L1 has an emission angle A2, and L2 has an emission angle B.

In order not to interfere with the path while the light L1 and L2 is extracted through the lens unit LEN, it is preferable to meet both the following Equations (1) and (2).

$$R_2 \geq D*\tan(A2) - M \qquad \text{Equation (1)}$$

$$(R_1 - M)/(D - d) = R_2 - L)/D = \tan(B) \qquad \text{Equation (2)}$$

In Equations (1) and (2), $R_1$ and $R_2$ are half the diameter of the opening area of the first barrier layer BL1 and half the diameter of the opening area of the second barrier layer BL2, respectively.

D is the distance between the upper surface of the passivation layer PAS and the lower surface of the lens unit LEN.

d is the distance between the upper surface of the first barrier layer BL1 and the lower surface of the second barrier layer BL2.

M is half the width of the flat portion of the passivation layer PAS.

A2 is the emission angle of L1, and B is the emission angle of L2.

When Equations (1) and (2) both are met, the barrier layers BL1 and BL2 do not overlap the flat portion of the passivation layer PAS, so that the light may be effectively extracted through the lens unit LEN without interfering with the path of the light L1 and L2.

Figure 17:
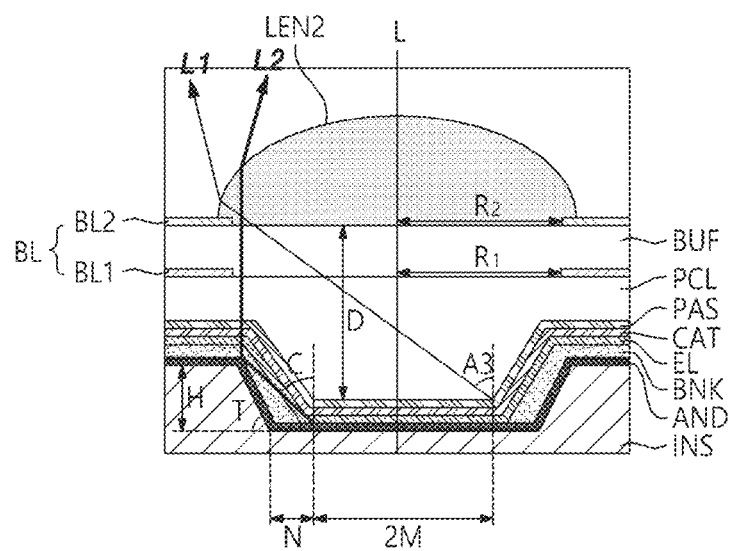
FIG. 17 is a cross-sectional view illustrating a light traveling path of the right view of FIG. 14B.

FIG. 17 is a cross-sectional view illustrating a light traveling path of the right view of FIG. 14B.

Referring to FIG. 17, the light L1 and L2 emitted from the light emitting layer EL may be extracted by the second lens unit LEN2.

L1 has an emission angle A3, and L2 has an emission angle C.

In order not to interfere with the path while the light L1 and L2 are extracted through the second lens unit LEN2, it is preferable to meet all of the following Equations (3), (4), and (5).

$$R_2 \geq D*\tan(A3) - M \qquad \text{Equation (3)}$$

-continued $$R_2 \geq M + N + H * \tan(90 - T) \quad \text{Equation (4)}$$

$$R_1 = R_2 \quad \text{Equation (5)}$$

In Equations (3), (4) and (5),

R1 and R2 are half the diameter of the opening area of the first barrier layer BL1 and half the diameter of the opening area of the second barrier layer BL2, respectively.

D is the distance between the upper surface of the passivation layer PAS and the lower surface of the second lens unit LEN2.

M is half the width of the flat portion of the passivation layer PAS.

N is the value obtained by subtracting M from the distance N+M from the center line L of the second lens unit LEN2 to the boundary of the flat portion of the concave portion.

A3 is the emission angle of L1, and C is the emission angle of L2.

When Equations (3), (4), and (5) are all met, the barrier layers BL1 and BL2 do not overlap the flat portion FLT of the concave portion CNC2, so that the light may be effectively extracted through the second lens unit LEN2 without interfering with the path of the light L1 and L2.

Figure 18:
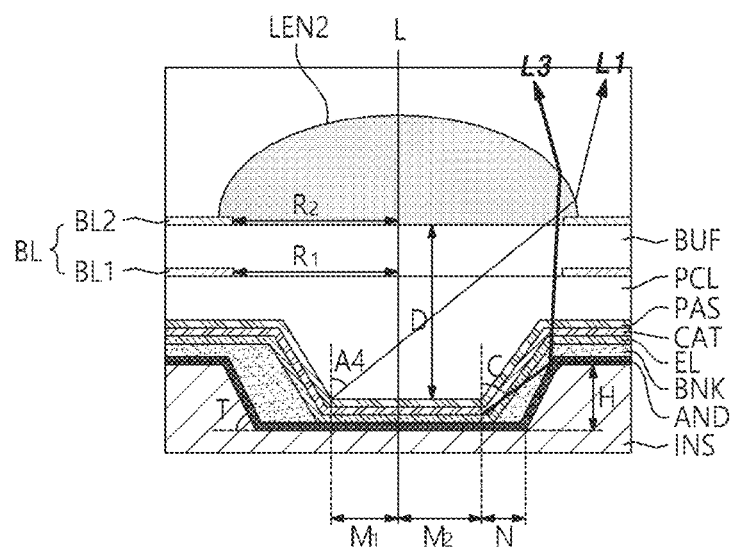
FIG. 18 is a cross-sectional view illustrating a light traveling path of the left view of FIG. 14B.

FIG. 18 is a cross-sectional view illustrating a light traveling path of the left view of FIG. 14B.

Referring to FIG. 18, the light L1 and L3 emitted from the light emitting layer EL may be extracted by the second lens unit LEN2.

L1 has an emission angle A4, and L3 has an emission angle C.

In order not to interfere with the path in the process of extracting the light L1 and L3 through the second lens unit LEN2, it is preferable to meet all of the following Equations (6), (7), and (8).

$$R_2 \geq D * \tan(A4) - M1 \quad \text{Equation (6)}$$

$$R_2 \geq M_2 + N + H * \tan(90 - T) \quad \text{Equation (7)}$$

$$R_1 = R_2 \quad \text{Equation (8)}$$

In Equations (6), (7) and (8), $R_1$ and $R_2$ are half the diameter of the opening area of the first barrier layer BL1 and half the diameter of the opening area of the second barrier layer BL2, respectively.

D is the distance between the upper surface of the passivation layer PAS and the lower surface of the second lens unit LEN2.

$M_1$ and $M_2$ are distances from the center line L of the second lens unit LEN2 to the boundary of the flat portion of the passivation layer PAS, and the shorter distance is $M_1$ and the longer distance is $M_2$.

N is the value obtained by subtracting $M_2$ from the distance N+$M_2$ from the center line L of the second lens unit LEN2 to the boundary of the flat portion of the concave portion.

A4 is the emission angle of L1, and C is the emission angle of L3.

When Equations 6, 7, and 8 are all met, the barrier layers BL1 and BL2 do not overlap the flat portion FLT of the concave portion CNC2, so that the light may be effectively extracted through the second lens unit LEN2 without interfering with the path of the light L1 and L3.

Figure 19:
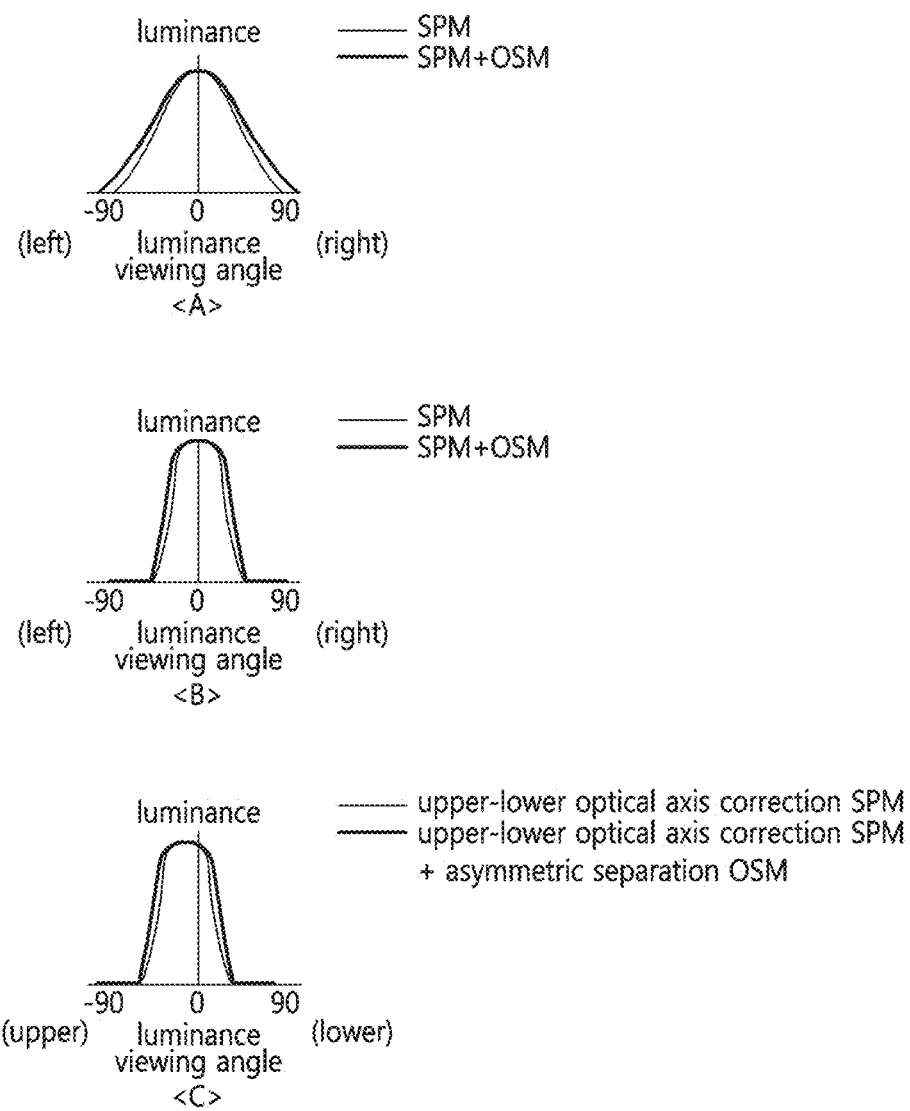
FIG. 19 is a view schematically illustrating changes in viewing angle luminance in upper and lower directions and left and right directions when an OSM structure applies in a wide viewing angle mode and a narrow viewing angle mode of an SPM.

FIG. 19 is a view schematically illustrating changes in viewing angle luminance in upper and lower directions and left and right directions when an OSM structure applies in a wide viewing angle mode and a narrow viewing angle mode of an SPM.

Referring to FIG. 19, <A> is a view schematically illustrating a left-right viewing angle luminance change in a wide viewing angle mode, <B> is a view schematically illustrating an up-down (or left-right) viewing angle luminance change in a narrow viewing angle mode, and <C> is a view schematically illustrating an up-down viewing angle luminance change in a wide viewing angle mode.

<A>, <B>, and <C> show viewing angle luminance changes when the SPM and the OSM structures are combined as compared with when only the SPM applies.

In the disclosure, the SPM means a system capable of switching between the wide viewing angle mode and the narrow viewing angle mode. To implement an SPM technology, it is preferable that the opening area of the bank layer includes a plurality of first opening areas and a plurality of second opening areas narrower than the first opening areas, and a plurality of first lens units corresponding to the plurality of first opening areas and a second lens unit corresponding to the plurality of second opening areas are included.

In the disclosure, the OSM refers to a case in which the insulation layer includes a flat portion and a concave portion formed of inclined portions surrounding the flat portion.

Referring to <A> of FIG. 19, when the OSM is applied to the SPM in the wide viewing angle mode (SPM+OSM), due to the condensing effect of the OSM, the luminance change according to the viewing angle is able to be decreased.

Referring to <B> of FIG. 19, when the OSM is applied to the SPM in the narrow viewing angle mode (SPM+OSM), due to the condensing effect of the OSM, the luminance change according to the viewing angle is able to be decreased.

Referring to <C> of FIG. 19, when the optical axis is corrected by moving the concave portion in the upper-lower direction so that the OSM has an asymmetric separation distance, the amount (luminance) of light extracted in the upper direction may be enhanced.

Here, the upper-lower direction may be substantially the same as the above-described first direction FD, and the left-right direction may be substantially the same as the above-described second direction SD.

For example, in <A> and <B>, 0 to 90 refer to a luminance viewing angle in one direction (right) of the second directions SD. Conversely, 0 to −90 refer to a luminance viewing angle in a direction (left) opposite to the one of the second directions SD.

In <C>, 0 to 90 refer to a luminance viewing angle in one direction (lower) of the first directions FD. Conversely, 0 to −90 refer to a luminance viewing angle in a direction (upper) opposite to the one of the first directions FD.

Figure 20:
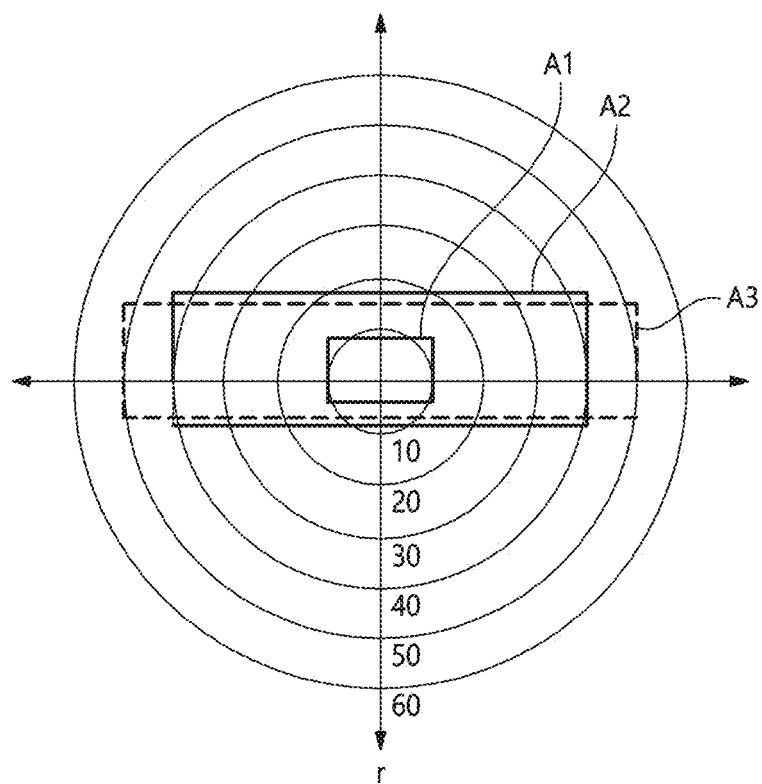
FIG. 20 is a view schematically illustrating areas in which four vertices where a minimum luminance value occurs are connected in an area defined in a polar coordinate system.

FIG. 20 is a view schematically illustrating areas in which four vertices where a minimum luminance value occurs are connected in an area defined in a polar coordinate system.

Referring to FIG. 20, a point in the polar coordinate system is represented by a radius r and an angle θ. r means the distance from the pole, and θ means the angle from the x-axis.

Here, when r has a negative value, it means that the point is away by the distance |r| in a direction opposite to the direction indicated by θ.

The three areas shown in the polar coordinate system are defined as shown in Table 1. The vertices in each area of Table 1 refer to vertices at which the minimum luminance value is obtained within the corresponding area.

TABLE 1

| | | Polar coordinates | |
|---|---|---|---|
| | | r | θ |
| A1 | vertex 1 | 13 | 39 |
| | vertex 2 | 13 | 141 |
| | vertex 3 | −11 | 22 |
| | vertex 4 | −11 | 158 |
| A2 | vertex 1 | 42 | 23 |
| | vertex 2 | 42 | 157 |
| | vertex 3 | −41 | 12 |
| | vertex 4 | −41 | 168 |
| A3 | vertex 1 | 51 | 17 |
| | vertex 2 | 51 | 163 |
| | vertex 3 | −50 | 8 |
| | vertex 4 | −50 | 172 |

Figure 21:
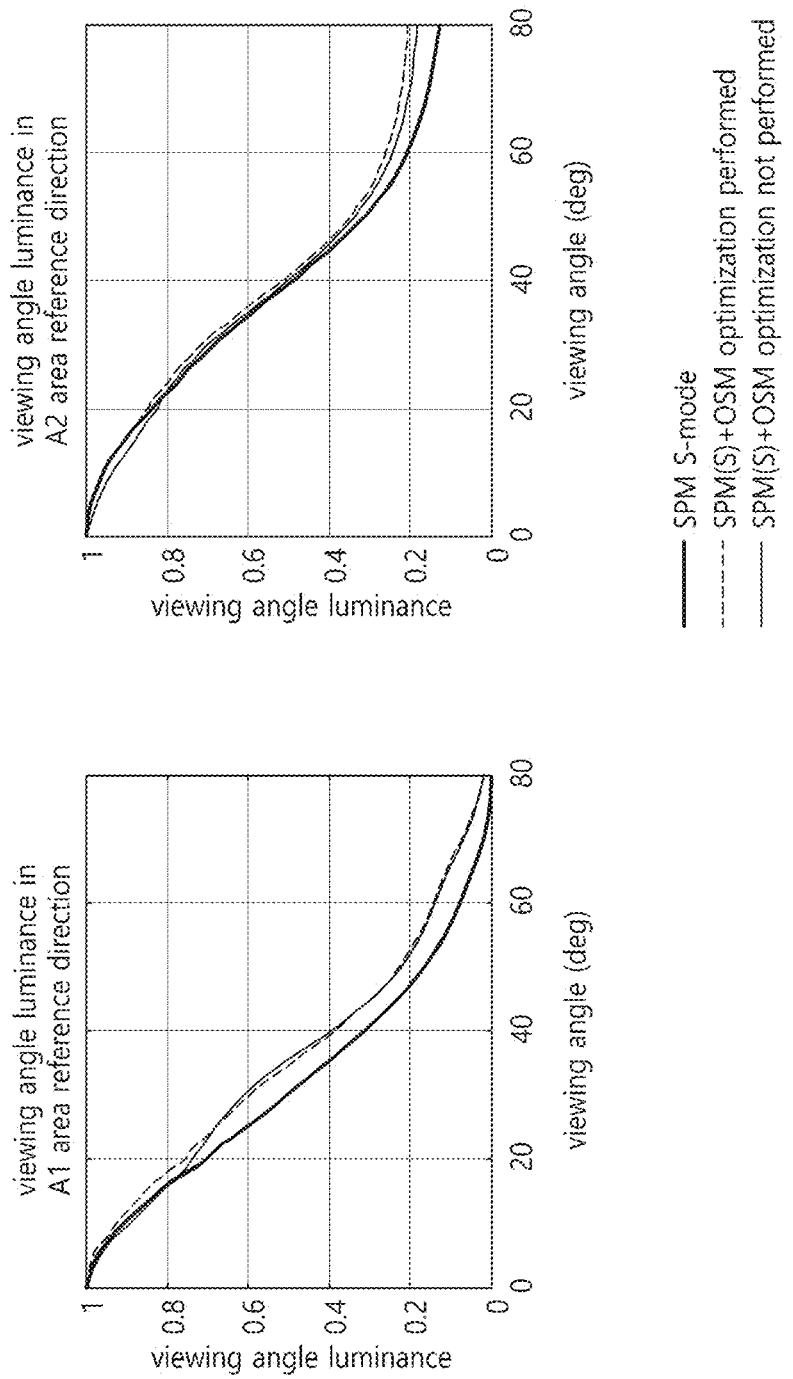
FIG. 21 is a graph illustrating a viewing angle luminance in a reference direction in areas A1 and A2 in FIG. 20.

FIG. 21 is a graph illustrating a viewing angle luminance in a reference direction in areas A1 and A2 in FIG. 20.

In FIG. 21, the viewing angle (deg) corresponds to r of the polar coordinate system described with reference to FIG. 20.

FIG. 21 illustrates graphs depending on whether optimization is performed when only the SPM applies to each of the A1 area reference direction viewing angle luminance and the A2 area reference direction viewing angle luminance and when both the SPM and the OSM apply.

Referring to FIG. 21, it may be identified that the viewing angle luminance is increased within the range of 0 to 80 degrees viewing angles when optimization is performed when both the SPM and the OSM are applied as compared to when only the SPM is applied in both the A1 area and the A2 area.

Embodiments of the disclosure described above are briefly described below.

A display device according to embodiments of the disclosure may comprise an insulation layer positioned on a substrate and including at least one concave portion including a flat portion and an inclined portion surrounding the flat portion in one subpixel and a bank layer positioned on the insulation layer and including an opening area in the subpixel. The opening area may be surrounded by the inclined portion. A center point of an area of the concave portion may not overlap a center point of the opening area of the bank layer.

In the display device according to embodiments of the disclosure, when viewed on a plane defined in a first direction and a second direction orthogonal to the first direction, a distance between two points where a virtual straight line passing through the center point of the area of the concave portion and parallel to the second direction meets a boundary of the area of the concave portion may be longer than a distance between two points where a virtual straight line passing through the center point of the area of the concave portion and parallel to the first direction meets the boundary of the area of the concave portion. A direction of a straight line passing through the center point of the area of the concave portion and the center point of the opening area of the bank layer may be the first direction.

In the display device according to embodiments of the disclosure, when viewed on a plane defined in a first direction and a second direction orthogonal to the first direction, a distance between two points where a virtual straight line passing through the center point of the area of the concave portion and parallel to the first direction meets a boundary of the area of the concave portion may be the same as a distance between two points where a virtual straight line passing through the center point of the area of the concave portion and parallel to the second direction meets a boundary of the area of the area of the concave portion. A direction of a straight line passing through the center point of the area of the concave portion and the center point of the opening area of the bank layer may be the first direction.

The display device according to embodiments of the disclosure may further comprise a plurality of barrier layers positioned in a non-opening area of the bank layer and positioned on the insulation layer.

In the display device according to embodiments of the disclosure, the barrier layer may include a first barrier layer positioned on the insulation layer and a second barrier layer positioned on the first barrier layer.

In the display device according to embodiments of the disclosure, at least one of the first barrier layer and the second barrier layer may be a sensor.

In the display device according to embodiments of the disclosure, an opening area of the second barrier layer may be larger than an opening area of the first barrier layer.

In the display device according to embodiments of the disclosure, an opening area of the first barrier layer and an opening area of the second barrier layer may have the same size.

The display device according to embodiments of the disclosure may further comprise a plurality of lens units positioned in an area corresponding to the concave portion.

In the display device according to embodiments of the disclosure, the opening area of the bank layer may include a plurality of first opening areas and a plurality of second opening areas narrower than the first opening areas, and wherein the display device further comprises a plurality of first lens units corresponding to the plurality of first opening areas and a plurality of second lens units corresponding to the plurality of second opening areas.

A display device according to embodiments of the disclosure may comprise an insulation layer positioned on a substrate and including at least one concave portion including a flat portion and an inclined portion surrounding the flat portion in one subpixel and a bank layer positioned on the insulation layer and including an opening area in the subpixel, wherein the opening area is surrounded by the inclined portion. The inclined portion of the concave portion may include a first inclined portion and a second inclined portion horizontally facing an upper portion of the subpixel and the first inclined portion. When measured in parallel with the upper surface of the subpixel, a distance from a center line of the opening area of the bank layer to an upper surface of the first inclined portion may differ from a distance from the center line of the opening area of the bank layer to an upper surface of the second inclined portion.

The display device according to embodiments of the disclosure may further comprise a plurality of barrier layers positioned in a non-opening area of the bank layer and positioned on the bank layer.

In the display device according to embodiments of the disclosure, the barrier layer may include a first barrier layer positioned on the bank layer and a second barrier layer positioned on the first barrier layer.

In the display device according to embodiments of the disclosure, at least one of the first barrier layer and the second barrier layer may be a sensor.

In the display device according to embodiments of the disclosure, an opening area of the second barrier layer may be larger than an opening area of the first barrier layer.

In the display device according to embodiments of the disclosure, an opening area of the first barrier layer and an opening area of the second barrier layer may have the same size.

The display device according to embodiments of the disclosure may further comprise a plurality of lens units positioned in an area corresponding to the concave portion.

In the display device according to embodiments of the disclosure, the concave portion may include a plurality of first concave portions and a plurality of second concave portions narrower than areas of the first concave portions. The display device may further comprise a plurality of first lens units positioned in areas corresponding to the plurality of first concave portions and a second lens unit positioned in areas corresponding to the plurality of second concave portions and narrower than areas of the plurality of first lens units.

The above description has been presented to enable any person skilled in the art to make and use the technical idea of the disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the disclosure. The above description and the accompanying drawings provide an example of the technical idea of the disclosure for illustrative purposes only. That is, the disclosed embodiments are intended to illustrate the scope of the technical idea of the disclosure.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
   a substrate;
   an insulation layer positioned on the substrate, the insulation layer including at least one concave portion having a center point, the at least one concave portion including a flat portion and an inclined portion surrounding the flat portion;
   one subpixel on the insulation layer in the at least one concave portion; and
   a bank layer positioned on the insulation layer and including an opening area corresponding to the subpixel, the opening area having a center point,
   wherein the opening area is surrounded by the inclined portion, and
   wherein the center point of the at least one concave portion is a non-zero offset from the center point of the opening area of the bank layer in more than one direction with respect to the substrate in a plan view of the display device.

2. The display device of claim 1, wherein when viewed on a plane defined in a first direction and a second direction orthogonal to the first direction, a distance between two points where a virtual straight line passing through the center point of the at least one concave portion and parallel to the second direction meets a boundary of the at least one concave portion is greater than a distance between two points where a virtual straight line passing through the center point of the at least one concave portion and parallel to the first direction meets the boundary of the at least one concave portion, and
   wherein a direction of a straight line passing through the center point of the at least one concave portion and the center point of the opening area of the bank layer is the first direction.

3. The display device of claim 1, wherein when viewed on a plane defined in a first direction and a second direction orthogonal to the first direction, a distance between two points where a virtual straight line passing through the center point of the at least one concave portion and parallel to the first direction meets a boundary of the at least one concave portion is the same as a distance between two points where a virtual straight line passing through the center point of the at least one concave portion and parallel to the second direction meets a boundary of the at least one concave portion, and
   wherein a direction of a straight line passing through the center point of the at least one concave portion and the center point of the opening area of the bank layer is the first direction.

4. The display device of claim 1, further comprising a plurality of barrier layers on the insulation layer and positioned in an area of the bank layer excluding the opening area.

5. The display device of claim 4, wherein the plurality of barrier layers includes:
   a first barrier layer positioned on the insulation layer; and
   a second barrier layer positioned on the first barrier layer.

6. The display device of claim 1, wherein the more than one direction includes a first direction and a second direction orthogonal to the first direction.

7. The display device of claim 5, wherein an opening area of the second barrier layer is larger than an opening area of the first barrier layer.

8. The display device of claim 5, wherein an opening area of the first barrier layer and an opening area of the second barrier layer have the same size.

9. The display device of claim 1, further comprising a plurality of lenses on the bank layer and corresponding to the at least one concave portion.

10. The display device of claim 1, wherein the opening area of the bank layer includes a plurality of first opening areas and a plurality of second opening areas, the second opening area being narrower than the first opening areas, and
   wherein the display device further comprises a plurality of first lenses corresponding to the plurality of first opening areas and a plurality of second lenses corresponding to the plurality of second opening areas.

11. A display device, comprising:
   a substrate;
   an insulation layer positioned on the substrate, the insulation layer including at least one concave portion, the at least one concave portion including a flat portion and an inclined portion surrounding the flat portion;
   one subpixel on the insulation layer in the at least one concave portion; and
   a bank layer positioned on the insulation layer and including an opening corresponding to the subpixel, wherein the opening is surrounded by the inclined portion of the at least one concave portion, wherein a center point of the at least one concave portion is a non-zero offset from a center point of the opening of the bank layer in two directions in a plan view of the display device.

12. The display device of claim 11, further comprising a plurality of barrier layers on the bank layer and positioned in an area of the bank layer excluding the opening.

13. The display device of claim 12, wherein the plurality of barrier layers includes:
a first barrier layer positioned on the bank layer; and
a second barrier layer positioned on the first barrier layer.

14. The display device of claim 11, wherein the two directions are a horizontal direction and a vertical direction in the plan view.

15. The display device of claim 13, wherein an opening of the second barrier layer is larger than an opening of the first barrier layer.

16. The display device of claim 13, wherein an opening of the first barrier layer and an opening of the second barrier layer have the same size.

17. A display device, comprising:
a substrate;
an insulation layer on the substrate, the insulation layer including at least one concave portion;
a subpixel on the insulation layer in the at least one concave portion;
a bank layer positioned on the insulation layer and including an opening corresponding to the subpixel; and
at least one lens on the bank layer and corresponding to the at least one concave portion,
wherein a center point of the at least one concave portion and a center point of the opening of the bank layer are a non-zero offset in a more than one direction in a plan view of the display device.

18. The display device of claim 17, wherein the at least one concave portion includes a plurality of first concave portions and a plurality of second concave portions, the second concave portion being narrower than the plurality of first concave portions, and
wherein the at least one lens further includes a plurality of first lenses positioned in areas corresponding to the plurality of first concave portions and a plurality of second lenses positioned in areas corresponding to the plurality of second concave portions,
wherein the plurality of second lens are narrower than the plurality of first lenses.

19. The display device of claim 17, wherein the at least one concave portion includes a flat portion and an inclined portion surrounding the flat portion.

20. The display device of claim 17, further comprising a first barrier layer positioned on the bank layer and a second barrier layer on the first barrier layer,
wherein the first barrier layer and the second barrier layer each have a respective aperture corresponding to the opening of the bank layer, and
wherein the at least one lens is positioned on the second barrier layer and overlaps the respective apertures of the first barrier layer and the second barrier layer.

21. The display device of claim 17, wherein the center point of the opening of the bank layer is offset from the center point of the opening of the bank layer in a vertical direction and a horizontal direction.

* * * * *